US008848272B2

(12) United States Patent
Naono

(10) Patent No.: US 8,848,272 B2
(45) Date of Patent: Sep. 30, 2014

(54) PIEZOELECTRIC ACTUATOR, VARIABLE CAPACITOR, AND OPTICAL DEFLECTION DEVICE

(75) Inventor: Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 202 days.

(21) Appl. No.: 13/434,227

(22) Filed: Mar. 29, 2012

(65) Prior Publication Data
US 2012/0250130 A1    Oct. 4, 2012

(30) Foreign Application Priority Data

Mar. 30, 2011   (JP) ................................. 2011-074430

(51) Int. Cl.
| | |
|---|---|
| *G02B 26/08* | (2006.01) |
| *H01G 5/18* | (2006.01) |
| *H01L 41/053* | (2006.01) |
| *H01G 5/38* | (2006.01) |
| *H01L 41/09* | (2006.01) |
| *H01L 41/187* | (2006.01) |

(52) U.S. Cl.
CPC .............. *H01L 41/0933* (2013.01); *H01G 5/18* (2013.01); *H01L 41/053* (2013.01); *H01G 5/38* (2013.01); *H01L 41/1875* (2013.01)
USPC ...................................................... 359/213.1

(58) Field of Classification Search
CPC combination set(s) only.
See application file for complete search history.

(56) References Cited

U.S. PATENT DOCUMENTS

| | | |
|---|---|---|
| 2008/0042521 A1 | 2/2008 | Kawakubo et al. |
| 2010/0242242 A1 | 9/2010 | Shimizu et al. |
| 2011/0032590 A1* | 2/2011 | Terada et al. ............... 359/199.4 |

FOREIGN PATENT DOCUMENTS

| | | |
|---|---|---|
| EP | 1870918 A1 | 12/2007 |
| EP | 2234184 A1 | 9/2010 |
| JP | 2004-127973 A | 4/2004 |
| JP | 2008-5642 A | 1/2008 |
| JP | 2010-251726 A | 11/2010 |

OTHER PUBLICATIONS

Kawakubo et al., "RF-MEMS Tunable Capacitor With 3 V Operation Using Folded Beam Piezoelectric Bimorph Actuator," Journal of Microelectromechanical Systems, Dec. 2006, vol. 15, No. 6, pp. 1759-1765.
Park et al., "Micromachined RF MEMS Tunable Capacitors Using Piezoelectric Actuators," Microwave Symposium Digest, IEEE MTT-S International, 2001, vol. 3, pp. 2111-2114.
Yee et al., "PZT actuated micromirror for fine-tracking mechanism of high-density optical data storage," Sensors and Actuators A, 2001, vol. 89, pp. 166-173.

* cited by examiner

*Primary Examiner* — Jade R Chwasz
(74) *Attorney, Agent, or Firm* — Birch, Stewart, Kolasch & Birch, LLP

(57) ABSTRACT

A piezoelectric actuator according to an aspect of the invention can include: a first actuator including a first piezoelectric driving part; and a second actuator including a second piezoelectric driving part. A central portion of the first actuator can be supported. The first actuator can be bent and deformed by applying a first driving voltage to the first piezoelectric driving part, so that both end portions of the first actuator can be displaced in a thickness direction of the first actuator. Both end portions of the second actuator can be coupled to the both end portions of the first actuator. The second actuator can be bent and deformed in the opposite direction to the first actuator by applying a second driving voltage to the second piezoelectric driving part, so that a central portion of the second actuator can be displaced in a thickness direction of the second actuator.

18 Claims, 17 Drawing Sheets

FIG.10

| ACTUATOR STRUCTURE | DOUBLE END SUPPORTING BEAM (1 mm × 310 μm) | CANTILEVER BEAM (LENGTH 310 μm) | CANTILEVER BEAM (LENGTH 500 μm) | EXAMPLE 1 (1 mm × 310 μm) | EXAMPLE 2 (1 mm × 310 μm) |
|---|---|---|---|---|---|
| MAXIMUM DISPLACEMENT (μm) | 2 | 3 | 5.5 | 8.3 | 11.7 |
| IN-PLANE DISPLACEMENT | ABSENCE | PRESENCE | PRESENCE | ABSENCE | ABSENCE |
| INITIAL WARP | PRESENCE | PRESENCE | PRESENCE | ABSENCE | ABSENCE |

US 8,848,272 B2

PIEZOELECTRIC ACTUATOR, VARIABLE CAPACITOR, AND OPTICAL DEFLECTION DEVICE

BACKGROUND OF THE INVENTION

1. Field of the Invention

The presently disclosed subject matter relates to a piezoelectric actuator, and in particular to a structure of a piezoelectric actuator adapted to perform a translational motion in a direction of a thickness of a device (a z-direction movement), and a variable capacitor and an optical deflection device which include this structure.

2. Description of the Related Art

Actuators which perform a translational motion (a z-direction movement) in a direction of a thickness of a device can be used in various applications. For example, such an actuator can be used in one of two parallel flat-plate electrodes, so that the actuator can be used as a variable capacitor based upon change of an inter-electrode gap. Further, such an actuator can be combined with a reflecting mirror optical system, so that a device for performing optical path change of light entered in a mirror part can be obtained, and the device has various applications such that the device can be used as a pickup tracking actuator for reading an optical disk or a variable-focus scanner.

When applying the actuator to the above described device, electrostatic force drive, piezoelectric drive, and the like may be performed by the actuator. When the electrostatic force drive is performed, a voltage close to 100 V is required. On the other hand, when the piezoelectric drive is performed, a large displacement can be obtained by a relatively low voltage. In the piezoelectric drive, a piezoelectric unimorph cantilever which can obtain a large displacement with a simple structure is frequently used. The piezoelectric unimorph cantilever is configured such that a lower electrode, a piezoelectric body, and an upper electrode are stacked on an oscillation plate, and has a beam (cantilever) structure where one end portion of a lever part is fixed. By applying electric field to the piezoelectric body, the piezoelectric body is deformed such that the whole lever part is curved upward like a bow. Further, as an actuator which can obtain a larger displacement, a bimorph actuator obtained by stacking two piezoelectric body layers to sandwich an electrode and an oscillation plate is also used.

Japanese Patent Application Laid-Open No. 2004-127973, Japanese Patent Application Laid-Open No. 2008-005642, Japanese Patent Application Laid-Open No. 2010-251726, Park, J. Y. et al., "Micromachined RF MEMS tunable capacitors using piezoelectric actuators", Microwave Symposium Digest, 2001 IEEE MTT-S International, vol. 3, pp. 2111-2114 (2001) and Kawakubo, T. et al., "RF-MEMS Tunable Capacitor With 3V Operation Using Folded Beam Piezoelectric Bimorph Actuator", Journal of Microelectromechanical Systems, vol. 15, No. 6, pp. 1759-1765 (2006) disclose configuration examples of a variable capacitor utilizing a cantilever-type piezoelectric actuator. Yee, Y. et al., "PZT actuated micromirror for fine-tracking mechanism of high-density optical data storage", Sensor and Actuator A89, pp. 166-173 (2001) discloses a configuration example of an optical pickup.

SUMMARY OF THE INVENTION

All of these devices require drive in a pure thickness direction (a z direction). However, in the case where driving is performed by the piezoelectric cantilever, device designing is always made difficult by following factors.

[1] There is an initial z displacement due to residual stress of a piezoelectric thin film (floating in the z direction occurs even in a state where an application voltage is 0).

[2] Movement in an in-plane direction (x and y directions) occurs at a driving time of the cantilever.

The above factor [1] becomes significant when the piezoelectric body is a thin film directly formed on a substrate. Since there is a difference in coefficient of thermal expansion between the piezoelectric body and the substrate, the factor [1] is caused by such a fact that the actuator is curved upward like a bow after the piezoelectric body film is formed on the substrate at a high temperature, and the temperature is returned to a normal temperature. This factor [1] becomes further significant when rigidity of the actuator is lowered to obtain a large displacement.

The above factor [2] is caused by the fact that the cantilever-type actuator essentially involves a rotational displacement. Therefore, in the cantilever-type actuator, it is difficult to obtain a pure z-direction displacement while suppressing an in-plane displacement in x and y directions.

In a general piezoelectric cantilever-type actuator, it is necessary to elongate the length of the actuator or thin the thickness of the oscillation plate in order to obtain a large displacement. However, this accommodation will results in facilitation of the factors [1] and [2]. That is, the achievement of a high displacement, and the factors [1] and [2] are in a tradeoff relationship. For such a reason, it was very difficult to obtain a pure z-direction displacement in a sufficient amount while the initial z displacement was being eliminated.

An example of a specific device will be described below.

(Regarding a Variable Capacitor)

Explanation is made with reference to FIG. 3 in Japanese Patent Application Laid-Open No. 2010-251726. FIG. 3 in Japanese Patent Application Laid-Open No. 2010-251726 is not attached in this specification, and reference numerals indicating members therein are in brackets. FIG. 3 in Japanese Patent Application Laid-Open No. 2010-251726 illustrates a variable capacitor using a piezoelectric cantilever which is a general actuator having a stack structure of a piezoelectric body and an oscillation plate. In a piezoelectric actuator (31) having a bimorph or unimorph actuator part (38) whose one end is fixed to a supporting body (39), one capacitor electrode (36) is arranged on one surface of the actuator part (38), and another capacitor electrode (33) is disposed so as to face the capacitor electrode (36). In the variable capacitor (30), by deforming the actuator part (38) of the piezoelectric actuator (31) in an arrow direction (an arc direction extending vertically), a distance between the capacitor electrodes (33) and (36) can be controlled, and an electrostatic capacitance can be changed. However, in such a conventional variable capacitor, the actuator part (38) of the piezoelectric actuator (31) is deformed in a state curved in a bow shape. Therefore, the capacitor electrodes (33) and (36) cannot come close to each other and separate from each other while being maintained in a parallel state. And, it is difficult to achieve a designed capacitance. Further, the cantilever is warped without voltage application due to warping caused by residual polarization of the piezoelectric body. Therefore, the capacitor electrodes (33) and (36) can come into contact with each other before applying driving voltage.

In the technique described Japanese Patent Application Laid-Open No. 2008-005642 or Kawakubo et al., an initial displacement of a contact portion is reduced by applying a folding structure to a cantilever. However, the electrodes can not be kept parallel to each other (see "FIG. 4" in Kawakubo et al.). As illustrated in "FIG. 12(a)" in Kawakubo et al., Kawakubo et al. propose a method of arranging two actuators in a sandwiching manner. However, this method makes a device larger and requires a supporting spring structure for relaxing a force pulled from the both sides, which results in a complicated structure.

(Regarding a Micromirror)

Explanation is made with reference to "FIG. 2", "FIG. 3", and "FIG. 4" in Yee et al. However, "FIG. 2", "FIG. 3" and "FIG. 4" are not attached to this specification. FIGS. 2 to 4 in Yee et al. disclose a micromirror for optical pickup. Yee et al. proposes a structure of an actuator for driving a reflecting face in a z direction (a normal direction of the reflecting face). In such an application, it is necessary to cause a mirror to reflect light without causing optical loss, and a motion in an in-plane direction during driving must be suppressed as much as possible. Therefore, in the structure described in Yee et al., four unimorph cantilevers are arranged so as to surround the mirror, so that a z-direction displacement is obtained while a displacement in an x-y in-plane direction is being suppressed.

However, an initial warp due to the residual stress of the piezoelectric body cannot be reduced. In fact, Yee et al. describes that an initial z displacement due to the initial warp is about 5 μm in an actuator which can obtain a z displacement up to about 5 μm.

The presently disclosed subject matter has been made in view of these circumstances, and a use of the presently disclosed subject matter is to provide a piezoelectric actuator which can eliminate influence of an initial displacement at a displacement point even if there is an initial warp due to a residual stress of a piezoelectric body. Further, another use of the presently disclosed subject matter is to a piezoelectric actuator which can suppress a displacement in an in-plane direction dramatically to obtain a pure thickness-direction displacement (a translational motion in the z direction) and can obtain a larger displacement amount. In addition, another use of the presently disclosed subject matter is to provide a variable capacitor and an optical deflection device which include the piezoelectric actuator.

A piezoelectric actuator of the presently disclosed subject matter can include: a first actuator including a first piezoelectric driving part; and a second actuator including a second piezoelectric driving part. A central portion of the first actuator in a longitudinal direction thereof can be supported. The first actuator can be bent and deformed by applying a first driving voltage to the first piezoelectric driving part, so that both end portions of the first actuator in the longitudinal direction can be displaced in a thickness direction of the first actuator. Both end portions of the second actuator in a longitudinal direction thereof can be coupled to the both end portions of the first actuator. The second actuator can be bent and deformed in the opposite direction to the first actuator by applying a second driving voltage to the second piezoelectric driving part, so that a central portion of the second actuator in the longitudinal direction thereof can be displaced in a thickness direction of the second actuator.

Other aspects of the presently disclosed subject matter will become apparent from the specification and the drawings.

According to the presently disclosed subject matter, the structure can be obtained by combining the first actuator, the central portion of the first actuator in the longitudinal direction being supported, and the second actuator, both end portions of the second actuator being coupled to the both end portions of the first actuator in the longitudinal direction of the first actuator to be supported. Even if there is a warp in each of the actuators due to the residual stress of the piezoelectric body, an initial displacement amount at the central portion in the longitudinal direction which can be a displacement point can be held at zero. Alternatively, the initial displacement can be vanishingly small.

Further, according to the piezoelectric actuator of the presently disclosed subject matter, a substantially pure thickness-direction (the z-direction) displacement can be obtained at the central portion of the actuator in the longitudinal direction in a final stage. Further, the displacement of the first actuator and the displacement of the second actuator are accumulated so that a further large displacement can be obtained.

BRIEF DESCRIPTION OF THE DRAWINGS

FIG. 10 is a table collectively illustrating effects of Examples 1 and 2 in comparison with Comparative Examples;

DETAILED DESCRIPTION OF EXEMPLARY EMBODIMENTS

Exemplary embodiments of the presently disclosed subject matter will be described in detail below with reference to the accompanying drawings.

First Embodiment

Figure 1:
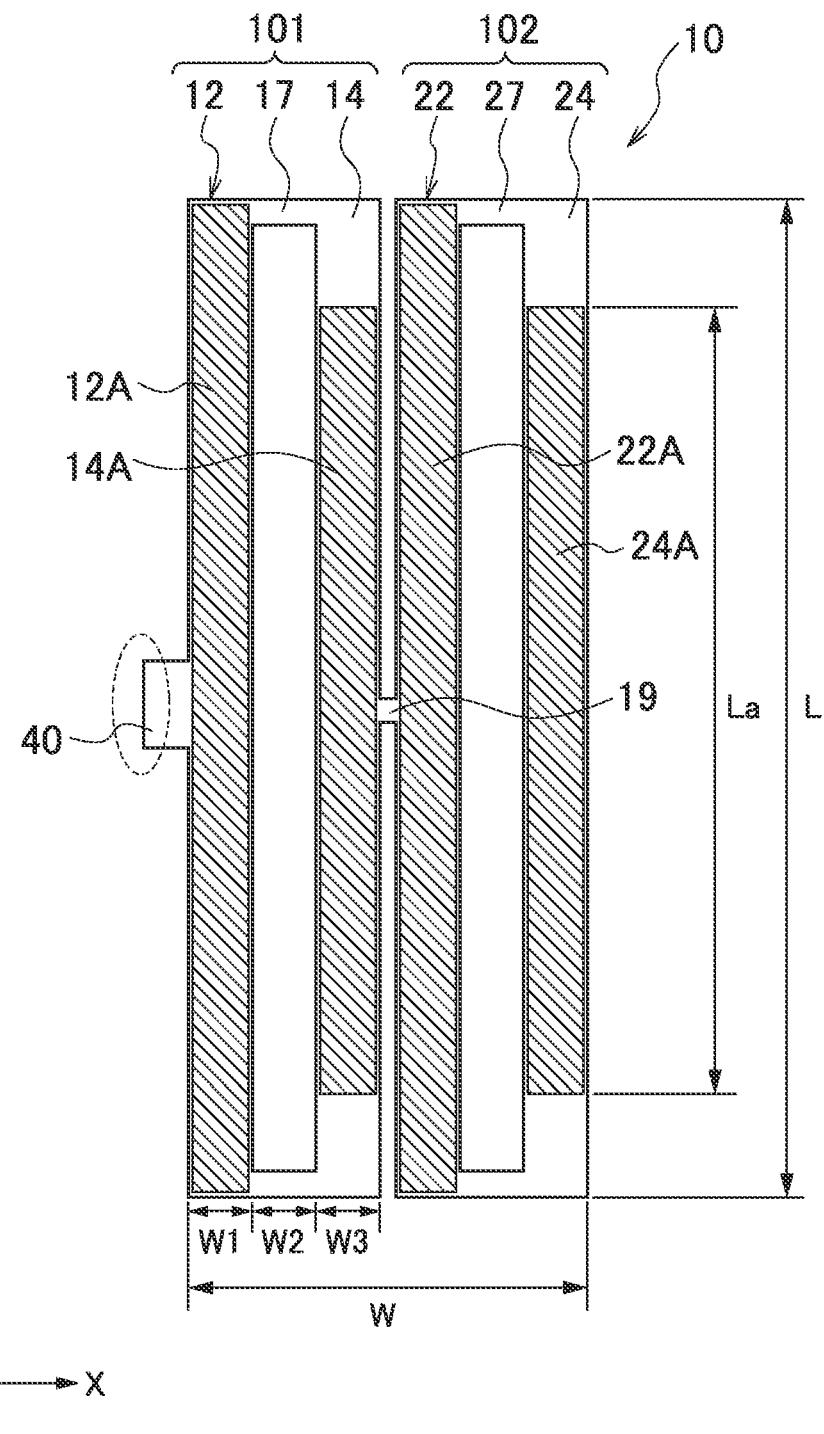
FIG. 1 is a plan view of a piezoelectric actuator according to a first embodiment of the presently disclosed subject matter.

FIG. 1 is a plan view of a piezoelectric actuator according to a first embodiment. For convenience sake of explanation, explanation is made while introducing x, y, and z axes perpendicular to one another where a lateral direction in FIG. 1 is defined as an x direction, a vertical direction is defined as a y direction, and a direction perpendicular to a sheet of paper of illustrating FIG. 1 is defined as a z direction. A piezoelectric actuator 10 includes a plurality of rectangular-strip-like piezoelectric unimorph actuators 12, 14, 22 and 24 which are elongated in y direction are arranged in parallel with one another. The actuators 12, 14, 22 and 24 are coupled integrally with each other via supporting bodies 17, 19 and 27.

Reference signs 12 and 22 each correspond to "first actuator", while reference signs 14 and 24 each correspond to "second actuator". An actuator group (reference sign 101) includes a combination of the actuator 12 arranged at a leftmost position in FIG. 1 and the actuator 14 arranged adjacent to the actuator 12 on the right hand of the first actuator 12 in parallel with the actuator 12. Similarly, an actuator group (reference sign 102) includes a combination of the actuator 22 and the actuator 24 arranged adjacent to the actuator 22 on the right hand of the actuator 22 in parallel with the actuator 22. The piezoelectric actuator 10 in this embodiment has a configuration where the two actuator groups 101 and 102 have been mechanically coupled to each other by the supporting body 19.

In the following explanation, the actuator attached with reference sign 12 can be called "first actuator" or "first-stage first actuator", while the actuator attached with reference sign 14 can be called "second actuator" or "first-stage second actuator". Similarly, the actuator attached with reference sign 22 can be called "first actuator" or "second-stage first actuator", while the actuator attached with reference sign 24 can be called "second actuator" or "second-stage second actuator".

Here, lengths L of the respective actuators (12, 14, 22, and 24) in y direction are equal to each other, and widths W1 and W3 of the respective actuators (12, 14, 22, and 24), and an inter-actuator distance W2 in x direction are equal to each other (W1=W2=W3). However, a specific aspect may be designed variously in implementation of the subject matter. The lengths of the respective actuators (12, 14, 22, and 24) may be different from one another, and the widths W1 and W3, and the inter-actuator distance W2 may be different from one another.

Shaded areas (reference signs 12A, 14A, 22A, and 24A) in FIG. 1 indicate piezoelectric driving parts of the respective actuators (12, 14, 22, and 24). The respective piezoelectric driving parts 12A, 14A, 22A, and 24A each have a piezoelectric unimorph structure where an upper electrode, a piezoelectric body, a lower electrode, and an oscillation plate are stacked from an upper layer (see FIG. 2). Each of the actuators 12, 14, 22, and 24 is bent and deformed like a bow in the thickness direction (z direction) upward in a concave state or downward in a concave state (in a convex manner as viewed from above) by applying a voltage between the electrodes sandwiching each of the piezoelectric driving parts 12A, 14A, 22A and 24A (see FIG. 3 and FIG. 4).

Figure 2:
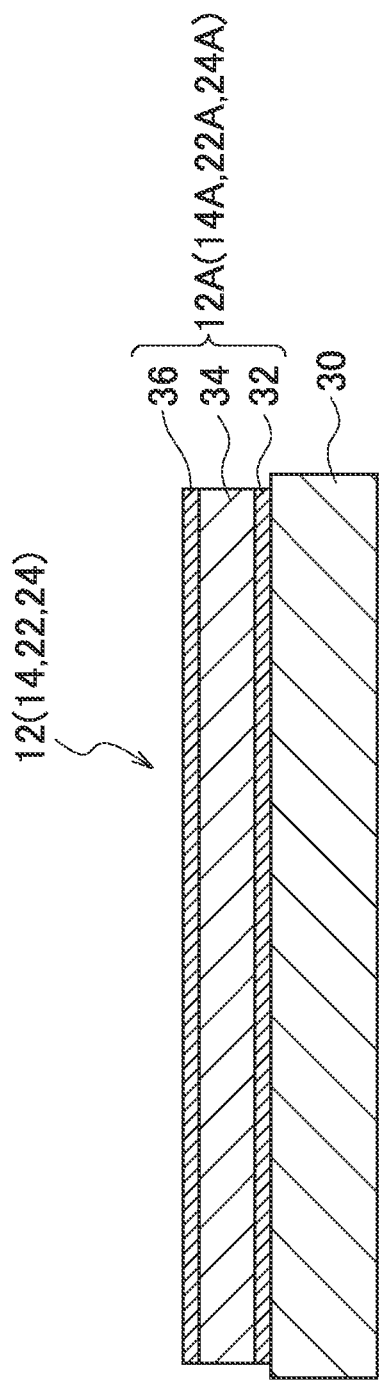
FIG. 2 is a sectional view of an actuator having a piezoelectric driving part.

FIG. 2 is a view illustrating a sectional structure of the actuator 12 having the piezoelectric driving part 12A. Here, the sectional view of the actuator 12 arranged on the leftmost position in FIG. 1 is illustrated. The other actuators 14, 22, and 24 each have a similar structure.

As illustrated in FIG. 2, each of the actuators 12, 14, 22, and 24 has a structure where a lower electrode 32, a piezoelectric body 34, and an upper electrode 36 are formed on an oscillation plate 30 in a stacked state in this order. Such a stacked structure can be obtained, for example, by sequentially forming respective layers of the lower electrode 32, the piezoelectric body 34 and the lower electrode 36 on a silicon (Si) substrate. A range where the piezoelectric body 34 is present so as to be sandwiched between the upper electrode 36 and the lower electrode 32 corresponds to the piezoelectric driving part (12A, 14A, 22A, 24A) illustrated in FIG. 1. In the above explanation, all of the actuators have the unimorph actuator structure. However, the actuators in the subject matter are not limited to this structure. For example, the actuators can each have a bimorph structure using two layered piezoelectric bodies.

Figure 3:
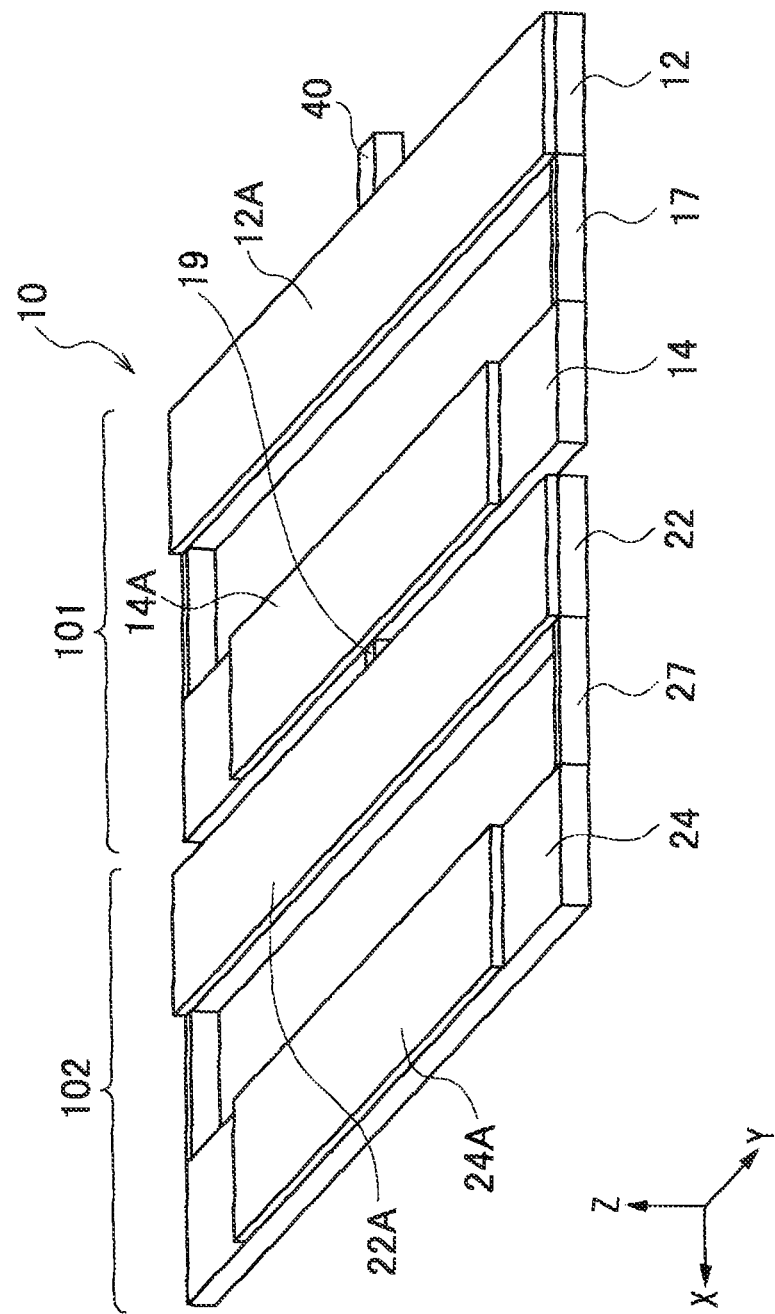
FIG. 3 is a perspective view illustrating a non-driving state of the piezoelectric actuator according to the first embodiment.
Figure 4:
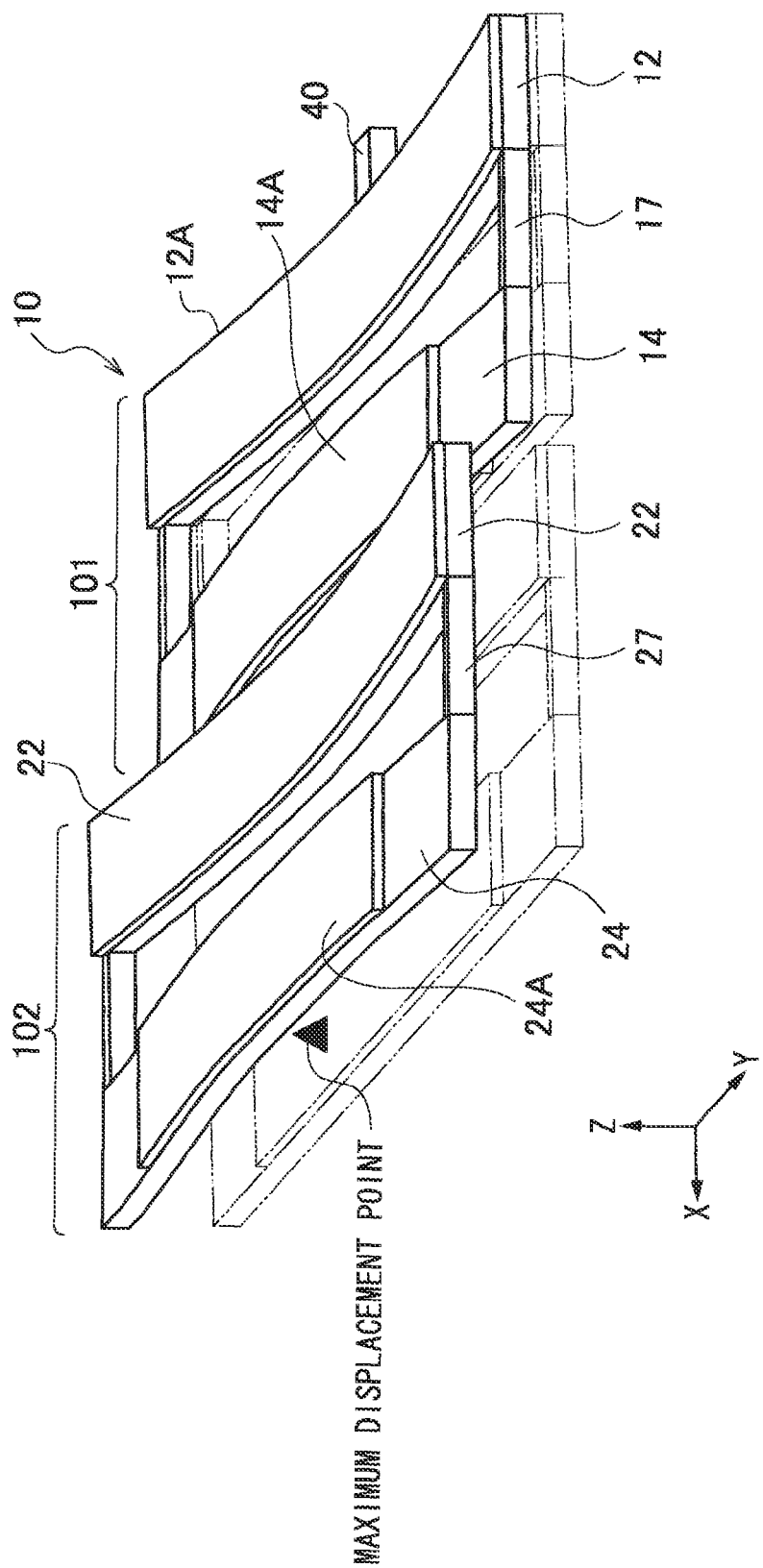
FIG. 4 is a perspective view illustrating a driving state of the piezoelectric actuator according to the first embodiment.

FIG. 3 is a perspective view of the piezoelectric actuator at a non-driving time, and FIG. 4 is a perspective view of the piezoelectric actuator at a driving time. For convenience sake of illustration, left and right in FIG. 3 and FIG. 4 are depicted in the opposite manner to left and right on FIG. 1. The first actuator 12 arranged on the rightmost position in FIG. 3 and FIG. 4 is the first-stage first actuator 12 arranged on the leftmost position in FIG. 1.

The first actuator 12 includes a fixing part 40 (corresponding to "first supporting body") for supporting the first actuator 12 at a central portion of the first actuator 12 in y direction (a longitudinal direction), as enclosed by a broken line in FIG. 1. The fixing part 40 is composed of a supporting body coupled integrally with the oscillation plate 30 (the supporting part for the piezoelectric driving part 12A) of the first actuator 12. It is preferred that the fixing part 40 is formed integrally with the oscillation plate 30. The fixing part 40 is coupled to a fixing and supporting member (not illustrated), and the first actuator 12 is displaced in a thickness direction of the first actuator 12 based upon the fixing part 40. Incidentally, the fixing and supporting member (not illustrated) which supports the fixing part 40 can also be formed integrally with the fixing part 40 (supporting body) by processing a silicon substrate.

The central portion of the first actuator 12 in y direction is supported (fixed) by the fixing part 40. When a voltage is applied to the first actuator 12 such that the piezoelectric body 34 of the piezoelectric driving part 12A is shrunk, the oscillation plate 30 is bent (warped upward like a bow) about the fixing part 40 so that the both end portions of the first actuator 12 in y direction move upward in z direction (see FIG. 4).

The both end portions, of the first actuator 12 bent and displaced in this manner, in y direction are coupled to the second actuator 14 via the supporting bodies 17 (corresponding to "second supporting bodies"). Both end portions of the second actuator 14 are coupled to both end portions [one side end face portion (the right side end face portion in FIG. 1) of the first actuator 12 opposed to one side end face portion (the left side end face portion in FIG. 1), in the longitudinal direction, of the first actuator 12 in a short side direction (x direction) of the first actuator 12] of the first actuator 12 provided with the fixing part 40 for supporting the central portion of the first actuator 12 via the supporting bodies 17.

With such a connection aspect, the second actuator 14 results in a double end beam supporting structure where both ends of the second actuator 14 are supported by the supporting bodies 17. Further, the second actuator 14 has a structure where a length La of the piezoelectric driving (active) part 14A is shorter than a length L of the oscillation plate 30 in the longitudinal direction (y direction) (La<L) and the piezoelectric driving part 14A is disposed at the central portion of the oscillation plate 30 in the longitudinal direction of the oscillation plate 30. In this case, it is desired that the length La of the piezoelectric driving part in the longitudinal direction is in a range of 30% to 80% of the length L of the oscillation plate in the longitudinal direction.

When the second actuator 14 is driven in a reverse direction to the first actuator 12, the second actuator 14 is displaced such that the central portion of the second actuator 14 curved and rises in z direction with respect to the supporting bodies 17 at both ends of the second actuator 14.

Thus, an actuator group 101 includes the first actuator 12 having the beam structure where the first actuator 12 is supported at the central portion of the first actuator 12 and the second actuator 14 having the double end beam supporting structure. By driving the respective actuators (12, 14) in the reverse directions to each other, the displacement amount in z direction according to a bending displacement of the first actuator 12 and the displacement amount in z direction according to a bending displacement of the second actuator 14 are superimposed on each other (the displacement in the z direction is amplified). Therefore, a displacement in z direction can be obtained at the central portion of the second actuator 14. The directions of the voltages applied to the respective actuators may be reversed to each other. In this case, by deforming the first actuator 12 in an upward convex shape and deforming the second actuator 14 in a downward convex shape, the central portion of the second actuator 14 can be displaced (moved downward) in one direction of z direction. In the following, for simplification, explanation is made assuming that such a movement that the first actuator 12 is deformed in a downward convex shape and the second actuator 14 is deformed in an upward convex shape is normal.

The central portion of the second actuator 14 is coupled to the second-stage first actuator 22 via the supporting body 19. Both end portions of the second-stage first actuator 22 are coupled to the second-stage second actuator 24 via the supporting bodies 27. An actuator group 102 includes the actuator 22 having the beam structure where the central portion of the actuator 22 is supported by the supporting body 19 and the actuator 24 having the beam structure where the both end portions of the actuator 24 are supported by the supporting bodies 27. The respective actuators (22, 24) are driven in directions opposed to each other like the actuator group 101. The actuator 22 whose central portion is supported is driven in the same direction as the first-stage first actuator 12, and the actuator 24 whose both end portions are supported is driven in the same direction as the first-stage second actuator 14.

Thereby, the second-stage first actuator 22 is bent in a bow shape with respect to the supporting body 19, so that both ends of the second-stage first actuator 22 are warped upward. Further, the second-stage actuator 24 is displaced in a bow shape with respect to the supporting bodies 27 at the both end portions such that the central portion of the second-stage actuator 24 rises in z direction (see FIG. 4).

Thus, according to the structure where the actuator groups 101 and 102 are connected to each other in parallel, the respective actuators (12, 14, 22, and 24) are driven such that the displacement directions are alternated in a zigzag manner of an upward convex state (indicated by reference sign 12), a downward convex state (indicated by reference sign 14), an upward convex state (indicated by reference sign 22), and a downward convex state (indicated by reference sign 24). Then, the displacement amount of the second actuator group 102 in z direction is accumulated on the displacement amount of the first actuator group 101, so that a large displacement in z direction can be obtained in the central portion of the second-stage second actuator 24 (the final stage actuator). A portion (the maximum displacement point) where the maximum displacement is obtained is indicated by a black triangle mark in FIG. 4.

The embodiment of FIG. 1 to FIG. 4 illustrates two actuator groups 101 and 102 which are coupled to each other. The second actuator group 102 can be omitted (a configuration composed of only an actuator group 101). Even in the configuration of only an actuator group 101 including the first actuator 12 and the second actuator 14 combined to each other, an effect of the translational displacement where the accumulated displacements of the respective actuators (12, 14) in z direction can be obtained.

Further, a plurality of actuator groups can be repeatedly joined to one another in such a manner that a similar actuator group is joined to the second actuator group 102 in the configuration illustrated in FIG. 1 to FIG. 4.

In the first embodiment, the first-stage actuator group 101 and the second-stage actuator group 102 which have the same configuration (size) are coupled to each other. However, actuator groups which are different in configuration can be coupled to each other. For example, actuator groups different in length of an oscillation plate, or actuator groups having oscillation plates with different widths (actuator widths) or having different distances between actuators can be combined.

<Regarding Configuration of Voltage Supply Part>

In the first embodiment, a first dive controller (not illustrated) which is a power supply source adapted to supply power for driving to the first-stage and second-stage first actuators 12 and 22, and a second drive controller (not illustrated) which is a power supply source adapted to supply power for driving to the first-stage and second-stage second actuators 14 and 24 are provided separately from each other. The first drive controller includes a driving circuit adapted to supply a driving voltage for actuating the first actuators 12 and 22 and an output control circuit for the driving circuit. The second drive controller includes a driving circuit adapted to supply a driving voltage for actuating the second actuators 14 and 24 and an output control circuit for the driving circuit.

In the first embodiment, the first-stage and second-stage first actuators 12 and 22 are driven by the same driving voltage, while the first-stage and second-stage second actuators 14 and 24 are driven by the same driving voltage (which is different from the driving voltage for the first actuators). Thus, two kinds of voltage supply parts (drive controllers) are used. However, voltage supply parts (drive controllers) can be individually provided to the respective actuators 12, 14, 22, and 24, for example, if different drive voltages can be applied to the respective actuators 12, 14, 22, and 24. The number of voltage supply parts can be designed as necessary.

Bending directions of the actuators can be made different by changing polarities of voltages applied to the first actuators 12 and 22 and the second actuators 14 and 24. Driving directions of the actuators 12, 14, 22, and 24 can be made different by make polar characters of the piezoelectric bodies in directions reversed to each other.

<Example of Piezoelectric Body>

As the piezoelectric body in this embodiment, a PZT thin film doped with 12% of Nb can be used. As a result of an eager research, the present inventors have found that a thin film having a high piezoelectric characteristic such as a piezoelectric constant $d_{31}=250$ pm/V can be produced stably by forming a film of PZT doped with 12% of Nb by a sputtering method.

Figure 5:
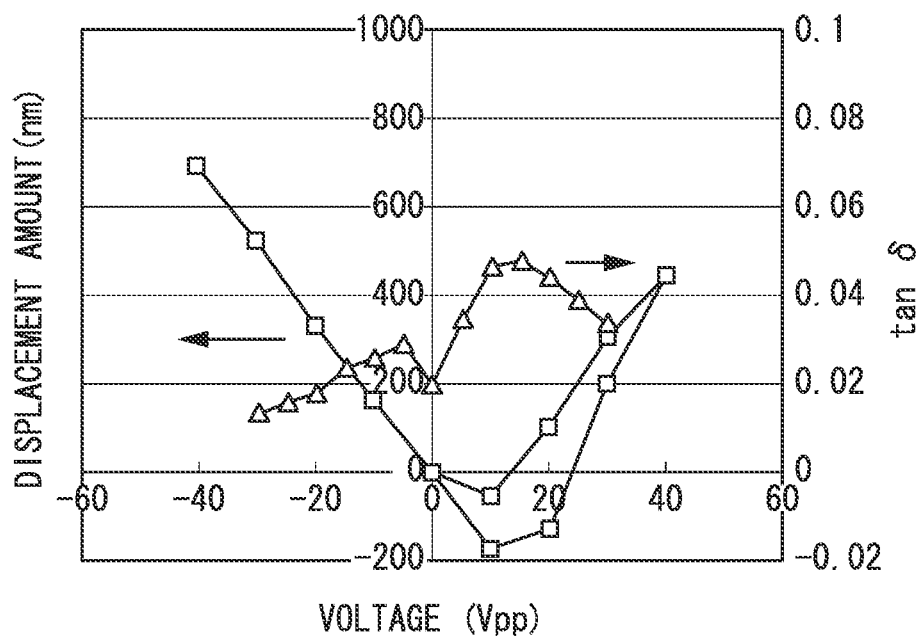
FIG. 5 is a graph illustrating a voltage-displacement characteristic of a piezoelectric thin film.

FIG. 5 is a graph illustrating a voltage-displacement characteristic of a PZT thin film doped with 12% of Nb (a piezoelectric thin film associated with Example). In FIG. 5, a plot point illustrated by white square mark represents a displacement amount and a plot point illustrated by white triangle mark represents dielectric tangent. As illustrated in FIG. 5, the piezoelectric thin film illustrates a very linear displacement response without causing polarization inversion within a range of −40 V to +10 V. Therefore, when voltages having polarities reversed to each other are applied to the group of the first actuators 12 and 22 having the central portion supported and the group of the second actuators 14 and 24 having the both end portions supported, driving voltages which can obtain a linear response within ±10 V can be selected.

When electric fields reversed to each other are applied to the first actuators (12, 22) and the second actuators (14, 24) which use piezoelectric thin films having such a characteristic, deformations such as illustrated in FIG. 4 can be obtained. As described above, the respective actuators (12, 14, 22, and 24) are deformed such that displacements of the actuators (12, 14, 22, and 24) in z direction are accumulated, so that a large displacement in z direction can be obtained at the central portion (the maximum displacement point) of the final stage actuator.

(Regarding Other Preferred Piezoelectric Materials)

As the piezoelectric body applicable to the first embodiment, there are materials containing one or more kinds of perovskite oxides (P) represented by the following formula.

General Formula $ABO_3$ (P)

(In the formula,

A: at least one element which is contained in A site and contains Pb,

B: at least one element which is contained in B site and is at least one element of Ti, Zr, V, Nb, Ta, Sb, Cr, Mo, W, Mn, Sc, Co, Cu, In, Sn, Ga, Zn, Cd, Fe, and Ni, and O: oxygen element.

A standard mole ratio of the A site element, the B site element, and the oxygen element is 1:1:3. The mole ratio may be deviated from the standard mole ratio within a range where the perovskite structure can be taken.)

As the perovskite-type oxides represented by the above general formula, there are lead-containing compounds such as lead titanate, lead zirconate titanate (PZT), lead zirconate, lead lanthanum titanate, lead lanthanum zirconate titanate, lead magnesium niobate zirconium titanate, lead nickel niobate zirconium titanate, or lead zinc niobate zirconium titanate, and mixed crystals thereof; and non-lead-containing compounds such as barium titanate, strontium barium titanate, bismuth sodium titanate, bismuth potassium titanate, sodium niobate, potassium niobate, lithium niobate, or bismuth ferrite, and mixed crystals thereof.

Further, it is preferred that the piezoelectric body film of the first embodiment contains one or more kinds of perovskite oxides (PX) represented by the following formula.

$A_a(Zr_x,Ti_y,M_{b-x-y})_bO_c$ (PX)

(In the formula,

A: at least one element which is contained in A site and contains Pb,

M is at least one element of V, Nb, Ta, and Sb.

$0<x<b$, $0<y<b$, and $0 \leq b-x-y$.

a:b:c=1:1:3 is a standard mole ratio. The mole ratio may be deviated from the standard mole ratio within a range where the perovskite structure can be taken.)

Since the piezoelectric body film made of the perovskite oxide represented by the above-described general formulae (P) and (PX) has a high piezoelectric strain constant ($d_{31}$ constant), a piezoelectric actuator provided with such a piezoelectric body film becomes excellent in displacement characteristic.

The piezoelectric actuator provided with the piezoelectric body film made of the perovskite oxide represented by the above-described general formulae (P) and (PX) has a voltage-displacement characteristic excellent in linearity in the driving voltage range. These piezoelectric materials have excellent piezoelectric characteristic in implementation of the presently disclosed subject matter.

A bulk piezoelectric body may be joined to a substrate. Preferably, a piezoelectric thin film can be directly formed on a substrate by a vapor-phase growth method, a sol-gel method or the like. Especially, it is preferred that the piezoelectric body in the first embodiment is a thin film with a thickness of 1 to 10 μm. In Example, a PZT thin film with a thickness of 4 μm formed by a sputtering method was used as the piezoelectric body. However, the piezoelectric body is not limited to this film.

<Regarding Influence of Initial Displacement>

Figure 6:
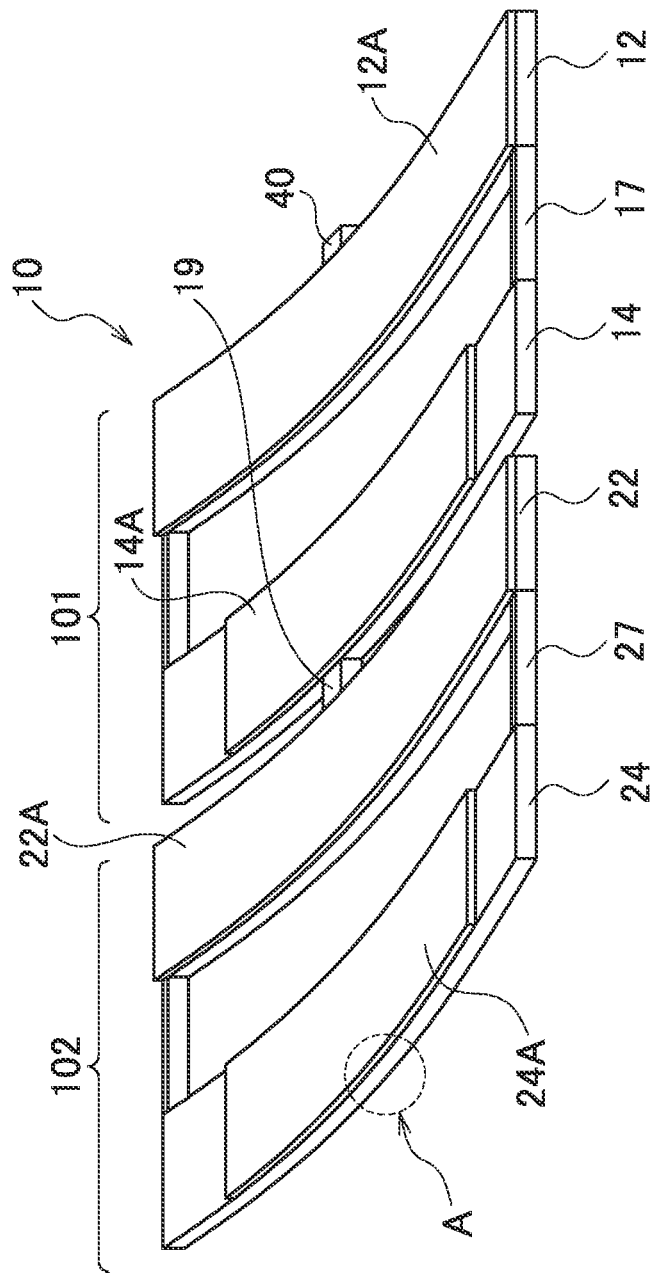
FIG. 6 is a view illustrating a state of the piezoelectric actuator when an initial warp occurs due to a residual stress of a piezoelectric body.

FIG. 6 illustrates a deformation when an initial warp due to residual stress of the piezoelectric body has occurred in the piezoelectric actuator 10 of the first embodiment. A portion enclosed by a broken line (a portion indicated by sign A) is the maximum displacement point when the maximum displacement can be obtained during driving of the piezoelectric actuator 10. It is understood that there is not an initial z displacement at this point depending on the initial warp.

<Regarding Manufacturing Process>

The respective actuators (12, 14, 22, and 24) in the piezoelectric actuator 10, and the supporting bodies 17, 19, and 27 connecting these actuators, the fixing part 31, and a fixing part supporting member (not illustrated) can be produced as a structure having the actuators, the supporting bodies, the fixing part, and the fixing part supporting member formed integrally by performing processing from a silicon substrate utilizing a semiconductor fabrication technique.

That is, the oscillation plates 30, the fixing parts 40, and the supporting bodies 17, 19, 27 in the respective actuators (12, 14, 22, and 24) are constituted as an integral body obtained by applying processing to a silicon substrate.

One Example of a Specific Manufacturing Method

Example

The piezoelectric actuator 10 was manufactured in the following manner.

(Step 1) First of all, a Ti adhesion layer with a thickness of 30 nm and an Ir electrode layer with a thickness of 150 nm were sequentially formed on an SOI (silicon on insulator) substrate. The Ti adhesion layer and the Ir electrode layer correspond to the lower electrode. A film formation temperature of the electrode was about 350° C.

(Step 2) A PZT layer with a thickness of 4 μm was formed on the substrate obtained above using a RF (radio frequency) magnetron sputtering apparatus. The magnetron sputtering apparatus used was a Ferroelectric Film-Forming Sputter Apparatus MPS type manufactured by ULVAC, Inc. Film-forming gas was mixed gas of 97.5% Ar and 2.5% $O_2$. A target material was one having composition of $Pb_{1.3}((Zr_{0.52}$ Ti$_{0.48}$)$_{0.88}$Nb$_{0.12}$)O$_3$. A film-forming pressure was 2.2 m Torr and a film-forming temperature was 450° C. A Pt/Ti which was an upper electrode was patterned on the substrate obtained above by lift-off process.

(Step 3) The piezoelectric actuator 10 described in FIG. 1 to FIG. 3 was obtained by processing the substrate obtained above based upon a silicon-working process (dry etching or the like).

The presently disclosed subject matter is not limited to the above example. A material of the substrate, an electric material, a piezoelectric material, a film thickness, a film forming condition and the like can be properly selected according to the use of the subject matter.

<Regarding Interpretation of Such a Description that a Central Portion of an Actuator in a Longitudinal Direction of the Actuator is Supported>

The specification describes that the central portion of the actuator in the longitudinal direction of the actuator is supported while the fixing part 40 and the supporting body 19 are exemplified. The "central portion" in the specification does not mean a strict central point definitely, but includes a region falling in a range grasped as an approximately central portion. For example, the fixing part or the supporting part can be provided at one position including a central portion (a true central point in design) of an actuator in the longitudinal direction of the actuator and the actuator is supported at the one position, and a plurality of fixing parts or supporting parts can be provided within a range grasped as an approximately central portion of an actuator in the longitudinal direction. Further, at least two fixing parts or supporting parts can be provided symmetrically regarding a central position in a longitudinal direction of an actuator within a region grasped as an approximately central portion. In such a case, a true central position in the longitudinal direction of an actuator can be neither fixed nor supported.

Second Embodiment

Figure 7:
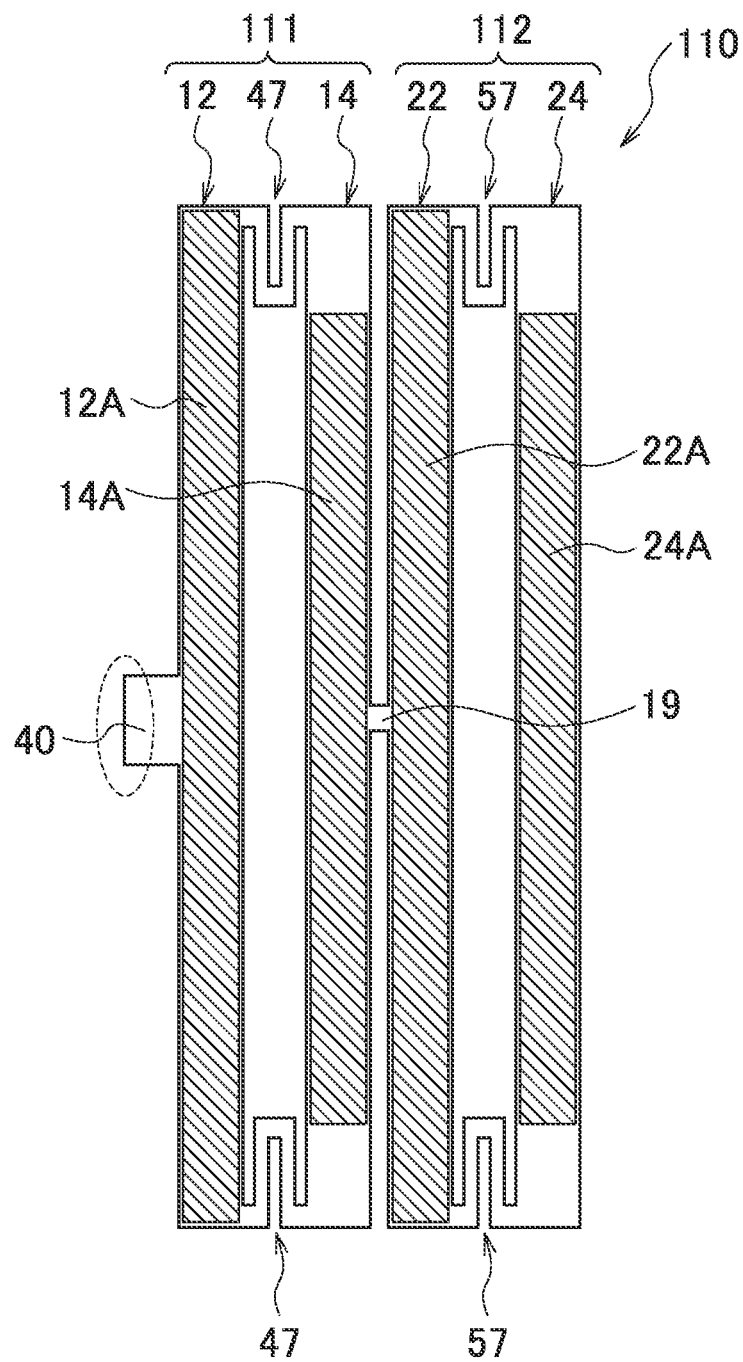
FIG. 7 is a plan view of a piezoelectric actuator according to a second embodiment of the presently disclosed subject matter.

FIG. 7 is a plan view of a piezoelectric actuator 110 according to a second embodiment. In the second embodiment illustrated in FIG. 7, elements identical with or similar to the configurations in the first embodiment described in FIG. 1 to FIG. 4 are attached with same reference signs, and explanation of the elements will be omitted.

The piezoelectric actuator 110 illustrated in FIG. 7, a meander-like structure is adopted at each of portions (indicated by reference signs 47 and 57) connecting the first actuator 12 and the second actuator 14 at both end portions of these members in the y direction.

That is, instead of the configuration of the supporting bodies 17 and 27 illustrated in FIG. 1, as illustrated in FIG. 7, plate-like coupling parts (hereinafter, called "meander coupling part") 47 and 57 having a folding-back (folding) structure are adopted. The meander coupling parts 47 and 57 are formed to be smaller and narrower in plate width than the sizes of the respective actuators (12, 14, 22, and 24). The meander coupling parts 47 and 57 are formed so as to be slenderer in plate width than each of the actuators (12, 14, 22, and 24). Since such meander coupling parts 47 and 57 absorb reaction force acting on the first actuator due to deformation of the second actuator, an effect of increasing a displacement amount of the whole actuator can be obtained. The meander coupling parts 47 and 57 are also formed in an integral manner by according to silicon processing like the supporting bodies 17 and 27 illustrated in FIG. 1. Incidentally, the number of times of folding back, the slenderness, and the plate thickness of each of the meander coupling parts 47 and 57 can be designed appropriately.

A (the first-stage) actuator group 111 is composed of the first actuator 12 and the second actuator 14 coupled to each other at the both ends of the first actuator 12 and the second actuator 14 in the longitudinal direction by the meander coupling parts 47. Similarly, a (the second-stage) actuator group 112 is composed of the first actuator 22 and the second actuator 24 coupled to each other at the both ends of the first actuator 12 and the second actuator 14 in the longitudinal direction by the meander coupling parts 57.

Figure 8:
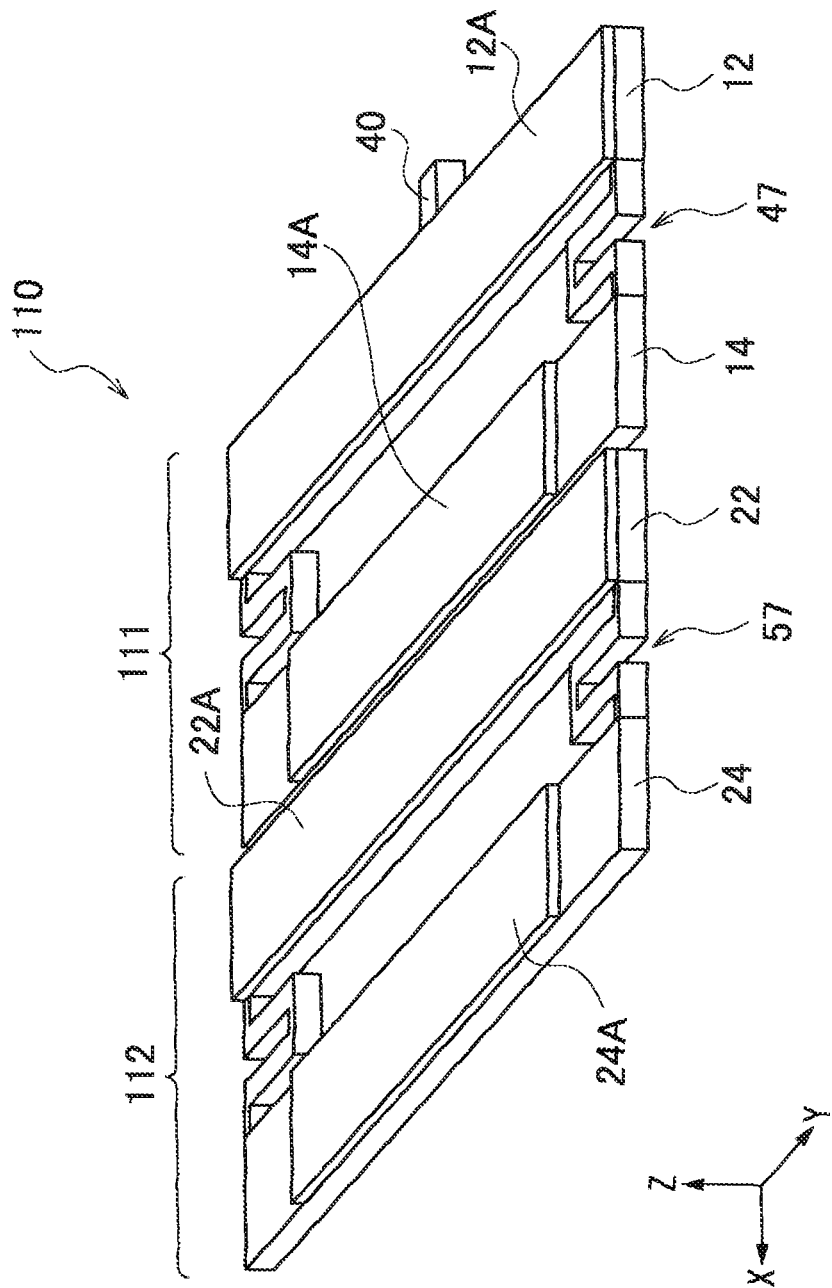
FIG. 8 is a perspective view illustrating a non-driving state of the piezoelectric actuator according to the second embodiment.
Figure 9:
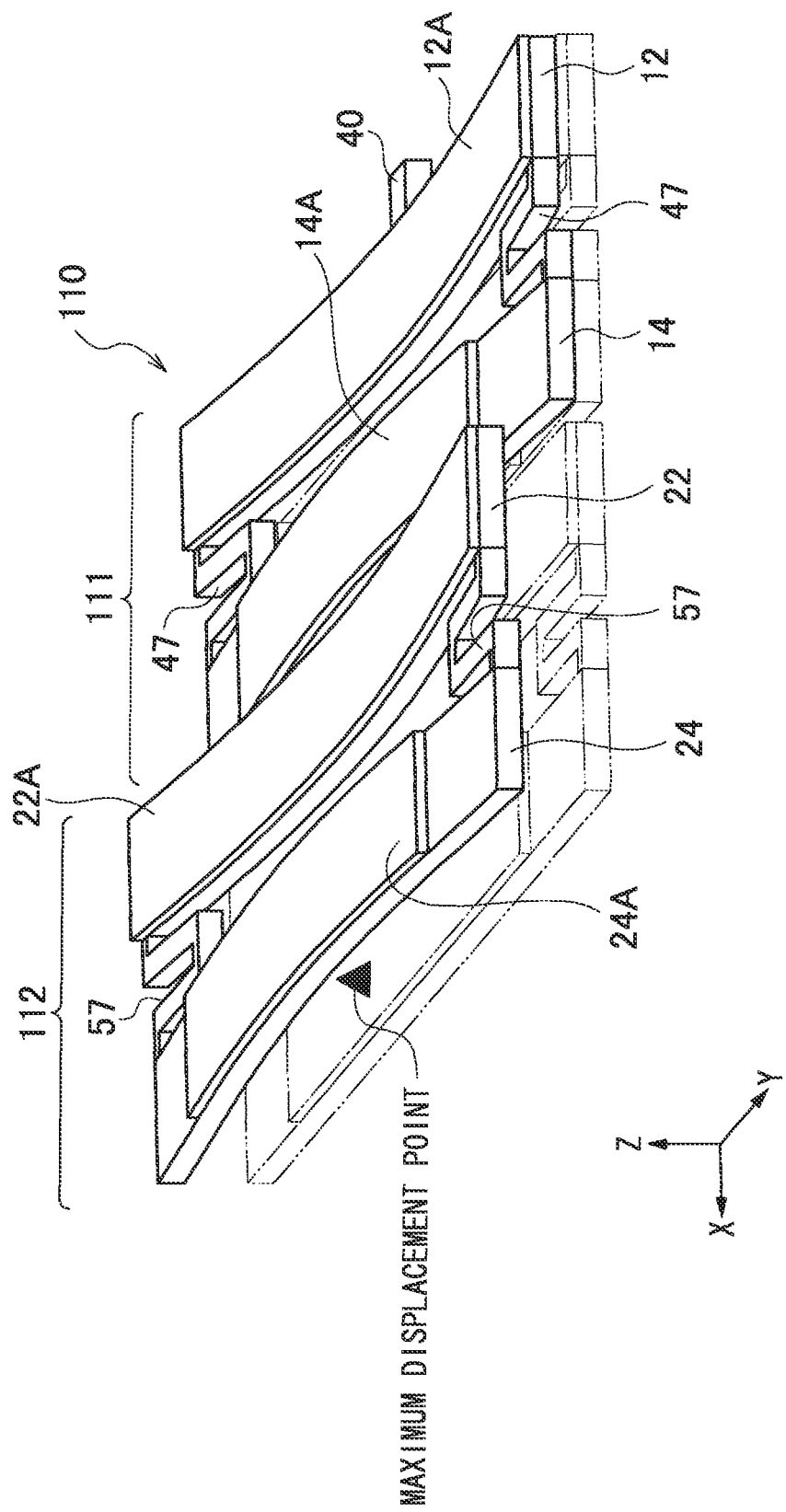
FIG. 9 is a perspective view illustrating a driving state of the piezoelectric actuator according to the second embodiment.

FIG. 8 is a perspective view illustrating an aspect of the piezoelectric actuator 110 at a non-driving time, and FIG. 9 is illustrating an aspect of the piezoelectric actuator 110 at a driving time. A driving method of each of the actuators 12, 14, 22, and 24 is similar to the case in the first embodiment illustrated in FIG. 1 to FIG. 4.

As illustrated in FIG. 7 to FIG. 9, by applying meander-like structures (reference signs 47 and 57) to portions coupling the actuators to each other to adopt a compact structure having a relatively low spring constant, a further high displacement can be obtained without increasing the size of the actuator (see FIG. 9).

In FIG. 7, the example where two actuator groups 111 and 112 have been repeatedly coupled is illustrated, but such a configuration that the second-stage actuator group 112 is not provided may be adopted or a configuration where further many actuator groups are coupled can be adopted.

Effects of Examples 1 and 2 Corresponding to the Respective Embodiments

FIG. 10 is a table illustrating effects of Examples 1 and 2 in comparison with Comparative Examples collectively.

In Table, "Example 1" illustrates a case where voltages applied to a first actuator and a second actuator were set to −10V and +10V, respectively, in a piezoelectric actuator having a configuration of parameters of W1=W2=W3=50 μm, W=310 μm, and L=1 mm in FIG. 1. At this time, a displacement amount (maximum displacement) and the like are illustrated in Table.

"Example 2" illustrates a case where voltages applied to a first actuator and a second actuator were set to −10 V and +10 V, respectively, in a piezoelectric actuator having a configuration of parameters similar to those in FIG. 1 of W1=W2=W3=50μ, W=310 μm, and L=1 mm in the configuration illustrated in FIG. 7. At this time, a displacement amount (maximum displacement) and the like are illustrated in Table.

As Comparative Examples, displacements of piezoelectric cantilevers with various sizes having a double end beam supporting structure and a cantilever structure are illustrated. That is, as the Comparative Examples, a piezoelectric unimorph actuator having a double end beam supporting structure (having a length L=1 mm and a width 310 μm), a piezoelectric unimorph actuator (having a length of 310 μm) having a cantilever structure, a piezoelectric unimorph actuator (having a length of 500 μm) having a cantilever structure were used. Displacement amounts (maximum displacements) and the like obtained when 10 V were applied to the respective configurations are illustrated in Table.

Incidentally, the piezoelectric performances of the piezoelectric bodies are compared with one another in the same condition of the respective Comparative Examples, Example 1 and Example 2.

As illustrated in FIG. 10, it is found that the configurations of Examples 1 and 2 obtain higher displacements than displacements of the conventional actuators (Comparative Examples).

Third Embodiment

Figure 11:
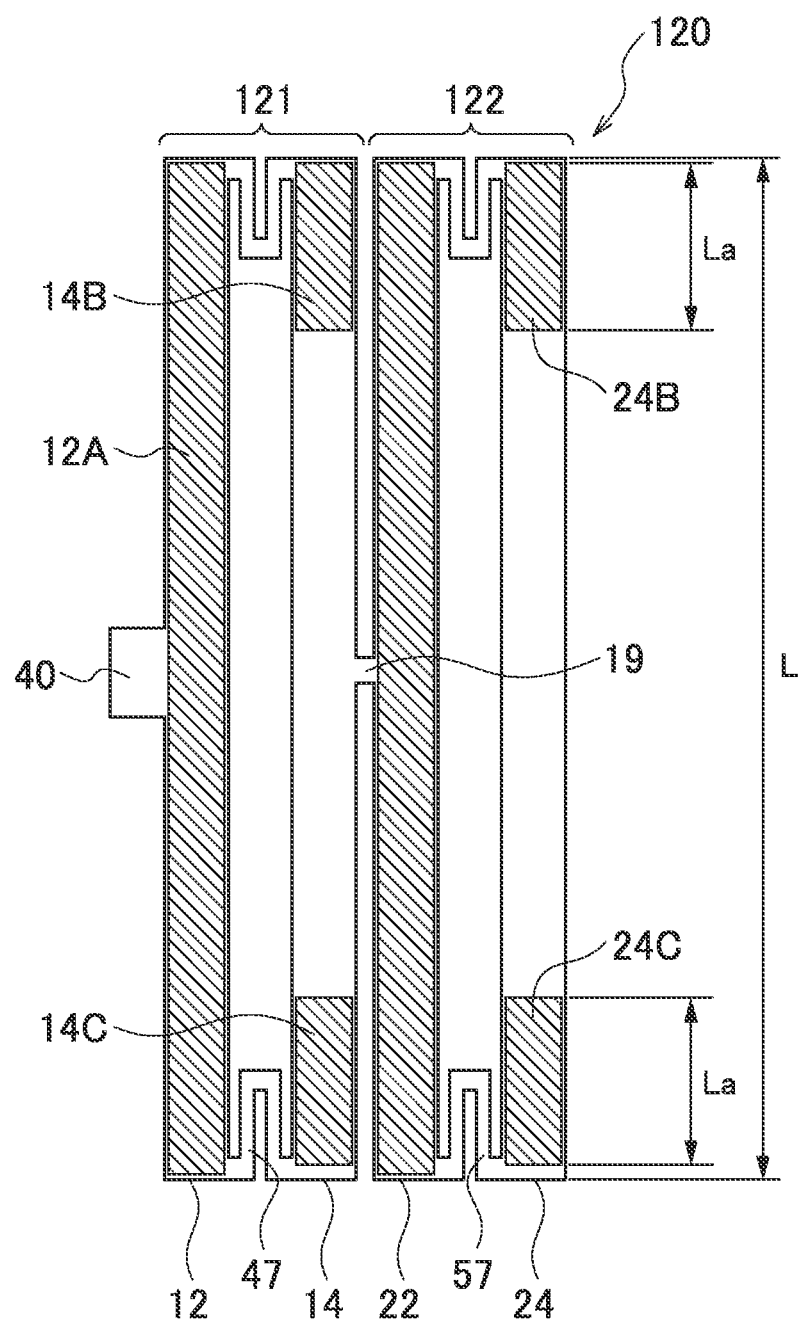
FIG. 11 is a plan view of a piezoelectric actuator according to a third embodiment of the presently disclosed subject matter.

FIG. 11 is a plan view of a piezoelectric actuator 120 according to a third embodiment. In the third embodiment illustrated in FIG. 11, elements identical with or similar to the configurations of the second embodiment illustrated in FIG. 7 to FIG. 9 are attached with same reference signs and explanation of the elements will be omitted.

In the piezoelectric actuator 120 illustrated in FIG. 11, piezoelectric driving parts 14B, 14C, 24B, and 24C in the second actuators 14 and 24 are disposed at both end portions of the oscillation plates of the second actuators 14 and 24 in a divided state so as to avoid central portions of the oscillation plates in longitudinal directions of the oscillation plates. In this case, it is preferred that lengths La of the piezoelectric driving parts 14B, 14C, 24B, and 24C are set within a range from 15 to 45% of the length L of the whole oscillation plate in the longitudinal direction.

In such a configuration, directions of electric fields applied to the respective piezoelectric driving parts 12A, 14B, 14C, 22A, 24B, and 24C are set to the same. That is, all the actuators 12, 14, 22, and 24 can be driven by applications of voltages having the same polarity, so that the first actuators 12 and 22, and the second actuators 14 and 24 can be bent in directions reversed to each other. As the simplest configuration, it is possible to drive the first actuators 12 and 22 and the second actuators 14 and 24 by a common drive voltage fed from one voltage supply part (drive controller).

According to the third embodiment, an effect similar to the effect obtained in the second embodiment illustrated in FIGS. 7 to 9 without requiring complicated electrode arrangement. Further, when a piezoelectric thin film having such a voltage-displacement characteristic as described in FIG. 5 is used, a region of a minus voltage illustrating a linear displacement response in a wide range can be utilized, so that a larger displacement can be obtained by application of a larger voltage, and control of a displacement amount is easy.

<Regarding Relationship Between an Arrangement Aspect of a Piezoelectric Driving Part to an Oscillation Plate and Lengths L and La of the Oscillation Plate and the Piezoelectric Driving Part>

Figure 12:
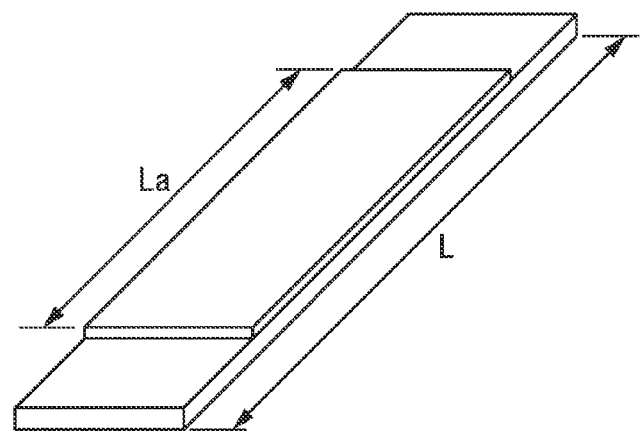
FIG. 12 is an illustrative view of an actuator having a configuration where a piezoelectric driving part (length: La) is disposed at a central portion of an oscillation plate having a length L.

FIG. 12 is an illustrative diagram illustrating an actuator having a configuration where a piezoelectric driving part (length of La) is disposed on a central portion of an oscillation plate having a length of L. By supporting both ends of the actuator in a longitudinal direction of the actuator, an actuator having a double end beam supporting structure can be obtained.

Figure 13:
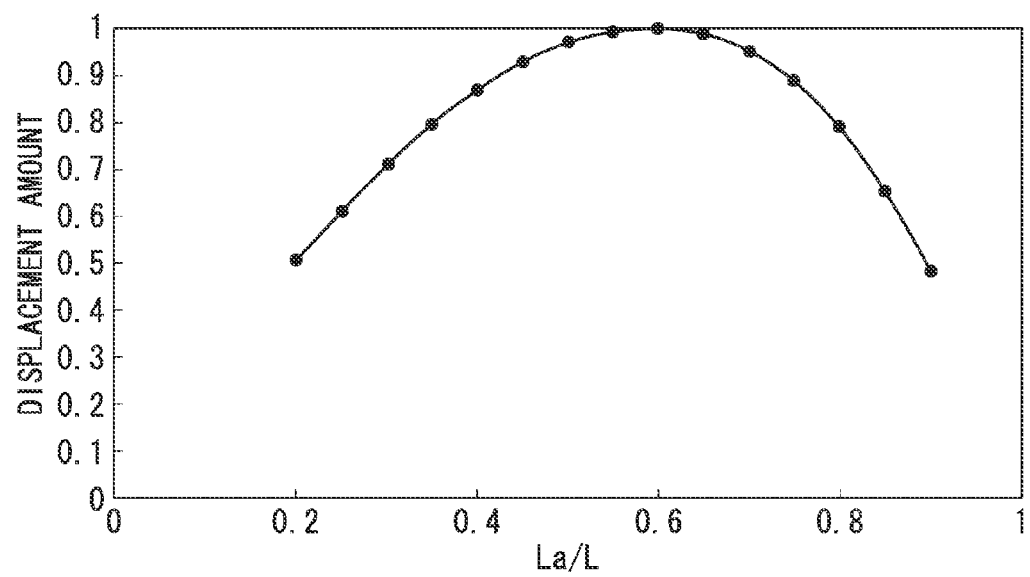
FIG. 13 is a graph illustrating a relationship between a ratio of lengths (La/L) and a displacement amount in the configuration illustrated in FIG. 12.

FIG. 13 is a graph illustrating a relationship between a ratio of lengths in the configuration illustrated in FIG. 12 (La/L) and a displacement amount at a central portion of an actuator during driving in a thickness direction of the actuator. In FIG. 13, a vertical axis illustrates a value normalized by the maximum value of the displacement amount. In FIG. 13, when such a condition that a range where the displacement amount reaches 70% or more of the maximum value is desirable is set, it is preferable to satisfy $0.3 \leq La/L \leq 0.8$. That is, in the actuator having the double end beam supporting structure where the piezoelectric driving part is disposed at the central portion of the oscillation plate, it is desirable that the length La of the piezoelectric driving part is in a range of 30 to 80% of the length L of the oscillation plate in the longitudinal plate.

Incidentally, in FIG. 13, it is a further preferable condition that the displacement amount exceeds 70% of the maximum value, and a preferable condition of La/L corresponding to respective ranges such as a range where the displacement amount reaches 80% or more of the maximum value or a range where the displacement amount reaches 90% or more of the maximum value can be read from the graph illustrated in FIG. 13.

Figure 14:
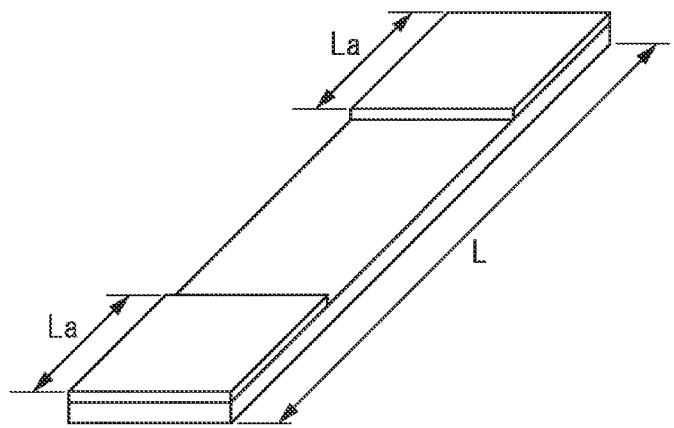
FIG. 14 is an illustrative view of an actuator having a configuration where divided portions of a piezoelectric driving part (length: La) are arranged at both end portions of an oscillation plate having a length L.

FIG. 14 is an illustrative diagram of an actuator having a configuration where piezoelectric driving parts (length of La) are arranged at both end portions of an oscillation plate having a length of L in a divided state so as to avoid a central portion of the oscillation plate. By supporting both ends of the actuator in the longitudinal direction of the actuator, an actuator having a double end beam supporting structure can be obtained.

Figure 15:
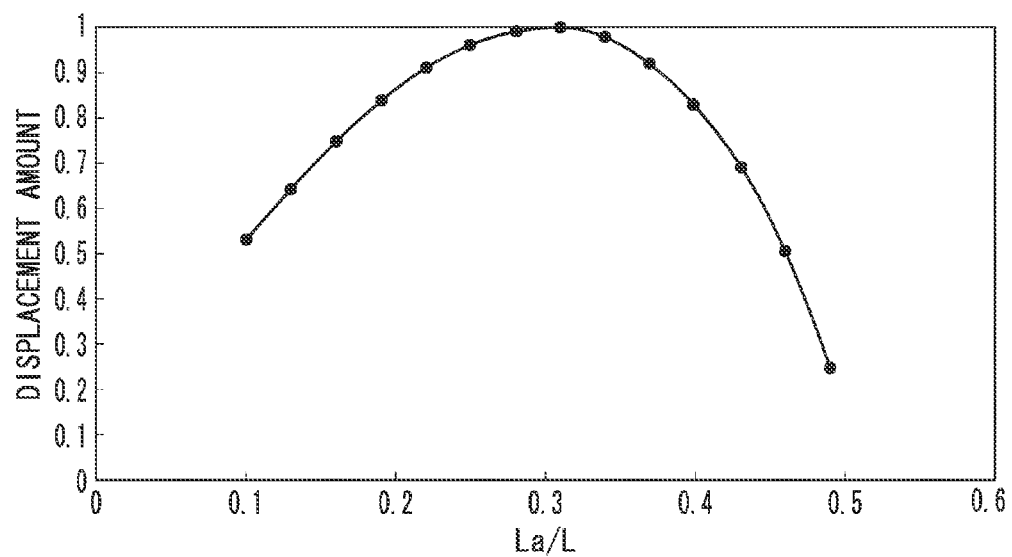
FIG. 15 is a graph illustrating a relationship between a ratio of lengths (La/L) and a displacement amount in the configuration illustrated in FIG. 14.

FIG. 15 is a graph illustrating a relationship between a ratio of lengths in the configuration illustrated in FIG. 14 (La/L) and a displacement amount at a central portion of an actuator during driving in a thickness direction of the actuator. In FIG. 15, a vertical axis illustrates a value normalized by the maximum value of the displacement amount. In FIG. 15, when such a condition that a range where the displacement amount reaches 70% or more of the maximum value is desirable is set, it is preferable to satisfy $0.15 \leq La/L \leq 0.45$. That is, in the actuator having the double end beam supporting structure with the aspect where the configuration where the piezoelectric driving parts are arranged at both end portion of the oscillation plate in a divided state so as to avoid the central portion of the oscillation plate, it is desirable that the length La of the piezoelectric driving part in the longitudinal direction is in a range of 15 to 45% of the length L of the oscillation plate in the longitudinal direction.

Incidentally, in FIG. 15, it is a further preferable condition that the displacement amount exceeds 70% of the maximum value, and a preferable condition of La/L corresponding to respective ranges such as a range where the displacement amount reaches 80% or more of the maximum value or a range where the displacement amount reaches 90% or more of the maximum value can be read from the graph illustrated in FIG. 15.

Fourth Embodiment

Figure 16:
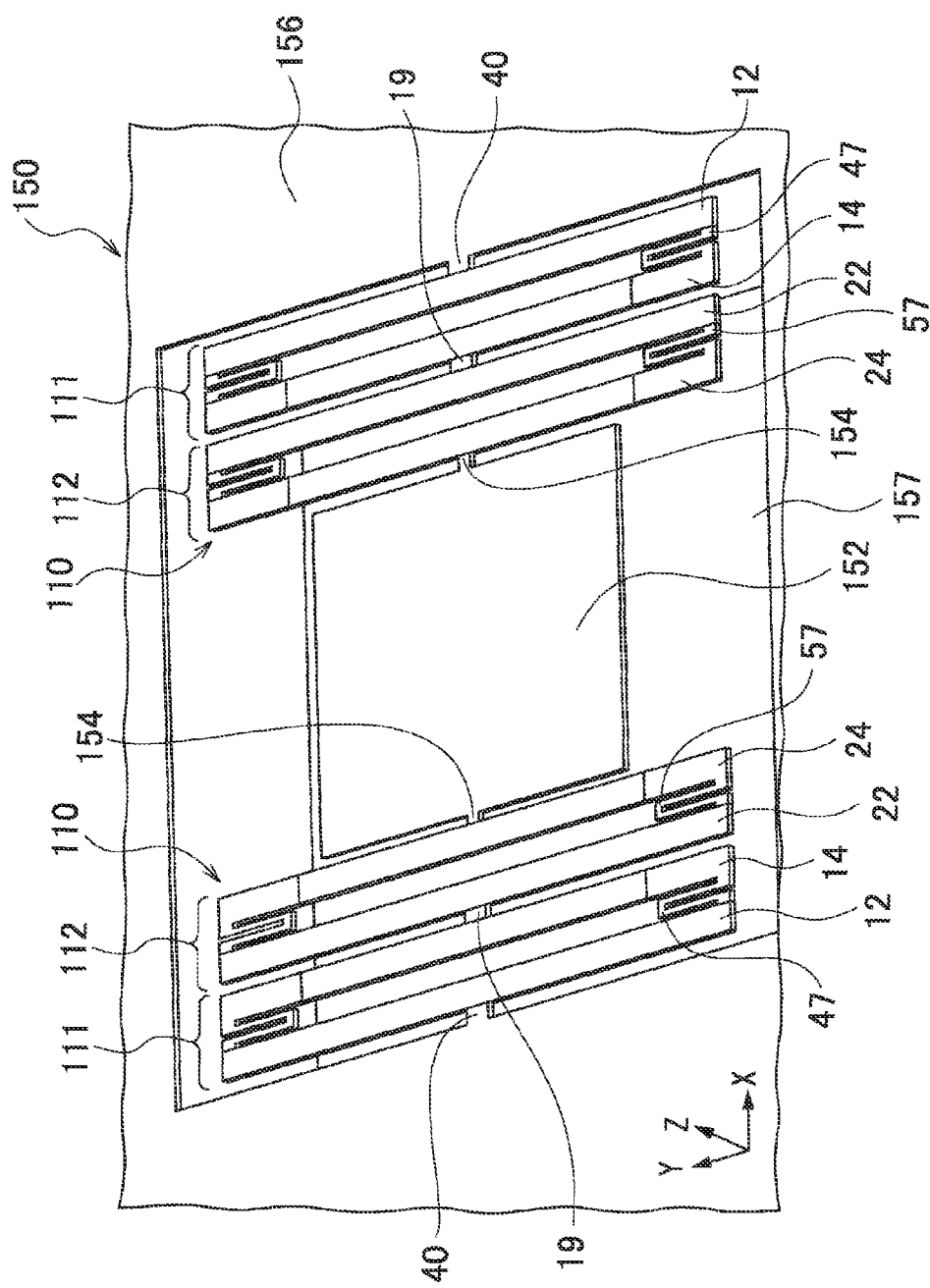
FIG. 16 is a view illustrating a structure of a movable electrode of a variable capacitor and a driving device for the movable electrode according to a fourth embodiment of the presently disclosed subject matter.

Next, an example of a variable capacitor provided with the piezoelectric actuator according to an embodiment of the presently disclosed subject matter will be described. FIG. 16 is a view illustrating a structure of a movable electrode 152 of a variable capacitor 150 according to a fourth embodiment of the presently disclosed subject matter and a driving device for the movable electrode 152.

In this embodiment, as the driving device of the movable electrode 152, the piezoelectric actuator described in FIG. 7 to FIG. 9 is adopted. In FIG. 16, elements identical with or similar to the configurations described in FIG. 7 to FIG. 9 are attached with same reference signs and explanation of the elements will be omitted. Incidentally, instead of the piezoelectric actuator 110, the piezoelectric actuator 10 according to the first embodiment (FIG. 1 to FIG. 4), the piezoelectric actuator 120 according to the third embodiment (FIG. 11), or the like can be adopted.

The movable electrode 152 is one obtained by forming a metal thin film (electrode layer) on a surface of a silicon substrate material. The piezoelectric actuators 110 are arranged symmetrically on both sides of the movable electrode 152 so as to sandwich the movable electrode 152, and maximum displacement portions of the respective piezoelectric actuators 110 are connected to the movable electrode 152 via coupling parts 154. Fixing parts 40 of the respective piezoelectric actuators 110 are coupled to a fixing frame 156 corresponding to a fixing and supporting member. A cavity 157 is formed on the back sides of the movable electrode 152 and the respective piezoelectric actuators 110, and the movable electrode 152 is supported by the coupling parts 154 to be arranged in a floating manner above the cavity 157.

Figure 17:
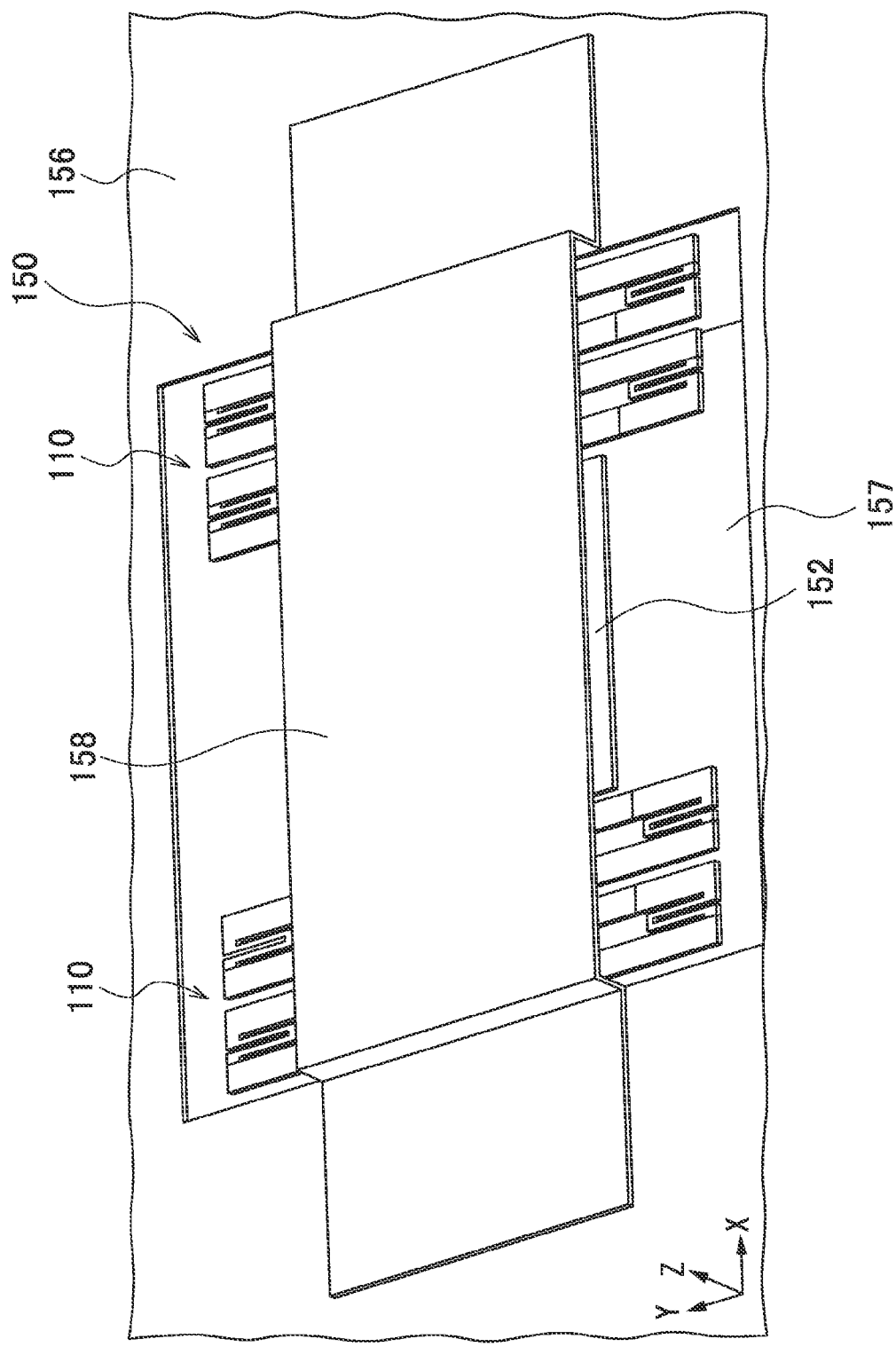
FIG. 17 is a view illustrating a configuration where a fixed electrode is arranged above the movable electrode.

FIG. 17 is a view illustrating a configuration where a fixed electrode 158 has been arranged above the movable electrode 152 described in FIG. 16. As illustrated in FIG. 17, the fixed electrode 158 is fixed and arranged so as to cover the movable electrode 152 from the above.

As described in FIGS. 7 to 9, when the piezoelectric actuators 110 are driven, the movable electrode 152 is translated in a thickness direction (in the z direction) so that a distance between the fixed electrode 158 and the movable electrode 152 varies. Thereby, the capacitance (electrostatic capacitance) is varied.

More Specific Example

As a specific Example of the variable capacitor according to the fourth embodiment, the dimension of the piezoelectric actuator 110 has W1=W2=W3=25 μm, and L=500 μm, and the size of the movable electrode 152 is a square having one side of 300 μm (300 μm square). The variable capacitor of this Example is manufactured according to the following procedure.

(Example of Manufacturing Process)

(Step 1): A lower electrode film is formed on an SOI substrate by a sputtering method or the like, and a piezoelectric body film is formed on the substrate thus obtained by a sputtering method or the like. Incidentally, a step for laminating a bulk piezoelectric body on a substrate and performing polishing may be adopted.

(Step 2): Next, the upper electrode is patterned by a photolithograph technology, and a PZT is then patterned by dry etching processing using plasma or wet etching processing using mixed solution of hydrofluoric acid and hydrochloric acid.

(Step 3): Thereafter, the lower electrode and a device layer Si are pattern-etched by dry etching processing using plasma.

(Step 4): Next, a sacrifice layer represented by resist is patterned on a portion on which a fixed electrode (reference sign 158 in FIG. 17) should be formed.

(Step 5): Thereafter, a metal structure serving as a fixed electrode is grown on the sacrifice layer in a plating manner by plating technology.

(Step 6): Thereby, a structure where the fixed electrode has been bridged above an actuator is obtained by removing the sacrifice layer by $O_2$ cleaning or the like.

(Step 7): Finally, a structure where the movable electrode 152 and the fixed electrode 158 such as illustrated in FIG. 17 have been formed above the cavity 157 can be obtained by applying Deep RIE (deep reactive ion etching) to a handle layer and a Box-$SiO_2$ layer on a back face.

The size of the variable capacitor device (the variable capacitor 150 illustrated in FIG. 16 and FIG. 17) manufactured the above process was 500 μm×640 μm, as one example, and the thickness of the oscillation plate of the piezoelectric unimorph actuator was 5 μm. In the configuration, the z-direction displacement of 3.4 μm is obtained by application of a voltage of 5 V. Further, even if an initial warp due to a residual stress of the piezoelectric body remains, the initial z position of the movable electrode is 0 (see FIG. 6), and a capacitance which completely coincides with a design of the capacitor can be obtained.

For example, when it is assumed that an initial gap between the fixed electrode 158 and the movable electrode 152 is 500 nm, the capacitance changes from 0.71 pF to 0.089 pF according to 5 V drive. In the case of the driving range, a change ratio of the capacitance (a ratio of the maximum value Cmax and the minimum value Cmin) Cmax/Cmin is 8. Incidentally, when a drive amount due to a minus voltage application is added, the change ratio of the capacitance is further expanded.

Fifth Embodiment

Next, an example of an optical deflection device provided with the piezoelectric actuator according to the embodiment of the presently disclosed subject matter will be described. In a configuration similar to the configuration described in FIG. 16, when a mirror for reflecting light is used in place of the movable electrode 152, a device which changes a reflecting point of light to move a focus or an illumination position can be obtained.

Figure 18:
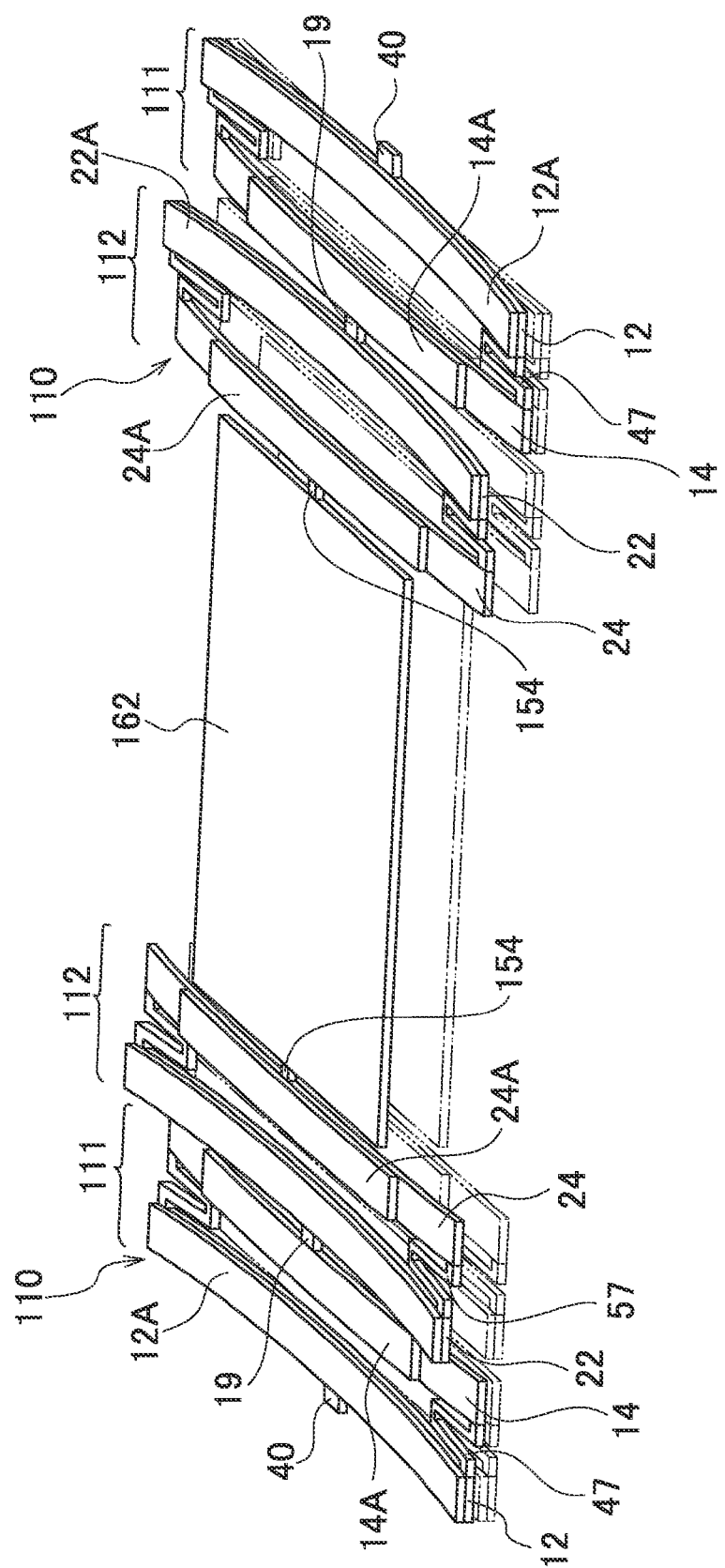
FIG. 18 is a perspective view illustrating a configuration of an optical deflection device according to a fifth embodiment of the presently disclosed subject matter.

FIG. 18 is a view illustrating a movement obtained when a mirror 162 is translated in a thickness direction of the mirror. In FIG. 18, elements identical with or similar to the configurations described in FIG. 7 to FIG. 9, FIG. 16 and FIG. 17 are attached with same reference signs and explanation of the elements will be omitted. Incidentally, in FIG. 18, illustration of the fixed frame 156 illustrated in FIG. 16 and FIG. 17 is omitted. According to the configuration of the micro mirror actuator illustrated in FIG. 18, a mirror 162 can be translated by driving of the piezoelectric actuators 110 and 110.

Figure 19:
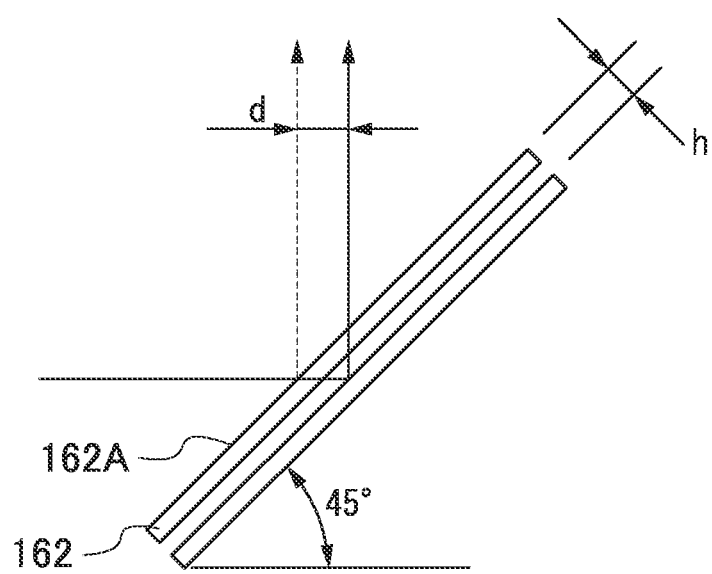
FIG. 19 is an illustrative view illustrating a configuration of a mirror device for an optical pickup.

Using the configuration illustrated in FIG. 18, a mirror actuator for tracking in an optical pickup such as illustrated in FIG. 19 can be manufactured. In FIG. 19, illustration is simplified, where only the mirror 162 is illustrated and description of the actuator pat is omitted.

As illustrated in FIG. 19, the mirror 162 is arranged in such an attitude that a reflecting face 162A of the mirror 162 is inclined to an incident axis of a laser beam at an angle of 45°. When the mirror 162 is displaced in a thickness direction of the mirror 162 by driving the actuator, the position of the reflecting face 162A is moved and an arrival point of the incident light to the reflecting face 162A is changed so that an optical axis of the reflecting light is shifted. When a displacement amount of the mirror 162 in the thickness direction is represented as h and a shift amount of the optical axis of the reflecting light is represented as d, the reflecting light can be controlled based upon a relationship of $d=(2)^{1/2} \times h$.

Incidentally, the inclination angle of the mirror 162 is not limited to 45° and the mirror 162 may take any arrangement aspect, and the optical path can be controlled according to such a conditions as an incident angle of incident light to a reflecting face, a position of the reflecting face, or a position at which incident light strikes against the reflecting face.

This technique is not limited to the example illustrated in FIG. 18 and FIG. 19, and can be utilized in various applications as an optical device which reflects light such as a laser beam to change an advancing direction of the light, an optical path length, an optical route, or the like.

<Comparison of the Piezoelectric Actuator According to the Embodiment of the Presently Disclosed Subject Matter with a Conventional Actuator>

Considering the actuator which was reported by Yee et al. as comparison, a displacement of 3.5 μm is obtained in application of a voltage of 5 V by lowering the thickness of the oscillation plate of the unimorph actuator down to 2 μm in Yee et al. In the Yee et al., however, an initial warp of 5 μm remains due to the residual stress during manufacture.

On the other hand, in the actuator similar to the fourth embodiment and the fifth embodiment, when the thickness of the oscillation plate is 5 μm, a displacement of 3.4 μm equivalent to the above conventional actuator can be obtained by application of a voltage of 5V. When the configuration of the embodiment of the presently disclosed subject matter is compared with the configuration described in Yee et al., since the thickness of the oscillation plate in the embodiment is thicker than the thickness of the oscillation plate described in Yee et al., rigidity is high so that yield is dramatically improved. Further, an initial displacement due to warp caused by residual stress in the configuration of the embodiment of the presently disclosed subject matter is zero.

Further, in the embodiment of the presently disclosed subject matter, when the thickness of the oscillation plate is set to 2 μm in the same manner as Yee et al., a displacement of 16.7 μm is obtained. Incidentally, in this case, the thickness of the piezoelectric film is set to 2 μm.

Advantageous Effects Obtained by the Embodiments of the Presently Disclosed Subject Matter (1) Even if each of the actuators includes a warp due to the residual stress of the piezoelectric body, an initial displacement amount at a central portion of the actuator in the longitudinal direction of the actuator which is a displacement point during piezoelectric driving is kept at zero.

(2) A substantially pure thickness-direction (z direction) displacement can be obtained at the central portion of the actuator in the longitudinal direction.

(3) As compared with a conventional ordinary piezoelectric actuator such as unimorph cantilever, a displacement amount equivalent to or more than a displacement amount obtained by the conventional piezoelectric actuator.

Another Modified Embodiment 1

In the first embodiment and the second embodiment, the configuration where the driving voltage controller for driving the first actuators 12 and 22 and the driving voltage controller for driving the second actuators 14 and 24 are provided separately from each other has been described, but such a configuration where a driving voltage controller outputs a plurality of driving voltages can be adopted. Further, it is unnecessary to configure a driving voltage supply source and a control device for the driving voltage supply source integrally necessarily. For example, it is possible to configure a similar system by utilizing a driving voltage supply source outputting a driving voltage for a first actuator, a driving voltage supply source outputting a driving voltage for a second actuator, and a controller for controlling these driving voltage supply sources.

Another Modified Embodiment 2

In the above embodiments, the example where an actuator group is composed of a plurality of piezoelectric unimorph actuators combined has been illustrated, but an aspect using bimorph actuators can be adopted.

Incidentally, the presently disclosed subject matter is not limited to the embodiments described above, but the presently disclosed subject matter can be modified variously within the technical idea of the subject matter by persons skilled in this art.

Additional Description

Aspects of the Subject Matter Disclosed

As grasped from the description about the embodiments of the presently disclosed subject matter described above in detail, disclosure of various technical ideas including the aspects at least described below is included in this specification.

(Aspect 1):

A piezoelectric actuator of aspect 1 can include: a first actuator including a first piezoelectric driving part, a central portion of the first actuator in a longitudinal direction of the first actuator being supported, the first actuator configured to be bent and deformed by applying a first driving voltage to the first piezoelectric driving part, so that both end portions of the first actuator in the longitudinal direction are displaced in a thickness direction of the first actuator; and a second actuator including a second piezoelectric driving part, both end portions of the second actuator in a longitudinal direction of the second actuator being coupled to the both end portions of the first actuator, the second actuator configured to be bent and deformed in an opposite direction to the first actuator by applying a second driving voltage to the second piezoelectric driving part, so that a central portion of the second actuator in the longitudinal direction of the second actuator is displaced in a thickness direction of the second actuator.

According to the aspect 1, an actuator group obtained by mechanically coupling the first actuator, a central portion of the first actuator in a longitudinal direction of the first actuator being supported, and the second actuator, both end portions of the second actuator being supported is configured. By deforming (bending-displacing) the first actuator and the second actuator in directions opposed to each other regarding the thickness directions of the first actuator and the second actuator, respective displacements of the first actuator and the second actuator are accumulated in the thickness direction, so that a large displacement is obtained. In addition, this configuration does not include rotational movement and can be realized by translational displacement in the thickness direction.

Further, even if an initial warp is caused by residual stress, the initial displacement at the central portion of the actuator is zero or is vanishingly small.

An aspect where a plurality of actuator groups composed of the first actuator and the second actuator combined are coupled to one another can be adopted.

(Aspect 2):

In the piezoelectric actuator according to the aspect 1, the first actuator and the second actuator can be arranged side by side such that the longitudinal direction of the first actuator and the longitudinal direction of the second actuator are parallel to each other.

According to the aspect 2, the respective actuators are arranged in parallel to each other such that the longitudinal directions of the actuators coincide with each other, so that both end portions of the first actuator and the second actuator in the longitudinal directions can be mechanically coupled to each other.

(Aspect 3):

In the piezoelectric actuator according to the aspect 1 or 2, one side end face portion of the first actuator in a short side direction at the central portion of the first actuator can be supported by a first supporting body, and the second actuator can be coupled, via second supporting bodies, to both end portions of the first actuator positioned on an opposite side to the one side end face portion supported by the first supporting body.

According to the aspect 3, the second actuator is connected to a side face of the first actuator on the opposite side of the first supporting body supporting the central portion of the first actuator. That is, coupling portions to the both end portions of the second actuator are provided on the opposite side to the supporting body supporting the central portion of the first actuator.

(Aspect 4):

The piezoelectric actuator according to any one of the aspects 1 to 3, can further include a plurality of actuator groups including the first actuator and the second actuator which are coupled to each other, wherein the central portion of the second actuator included in one actuator group and a central portion of the first actuator included in the other actuator group arranged adjacent to the one actuator group are coupled to each other.

By coupling a plurality of actuator groups composed of the first actuator and the second actuator combined to each other, a further large thickness-direction displacement can be obtained.

The plurality of actuator groups may have the same configuration unit, and actuator groups different in configuration may be connected to each other.

(Aspect 5):

In the piezoelectric actuator according to any one of the aspects 1 to 4, each of the first actuator and the second actuator can be a unimorph actuator including a lower electrode, a piezoelectric body, and an upper electrode which are stacked on an oscillation plate in a thickness direction of each of the first actuator and the second actuator in this order.

As an actuator element, an aspect adopting a bimorph actuator is made possible, but the unimorph actuator is simple in structure and can be easy to manufacture. Further, sine an initial warp due to residual stress occurs easily in the unimorph actuator, application of the presently disclosed subject matter which can avoid influence of the initial warp is more effective.

(Aspect 6):

In the piezoelectric actuator according to any one of the aspects 1 to 5, the second actuator can include a lower electrode, a piezoelectric body, and an upper electrode which are stacked on an oscillation plate in the thickness direction of the second actuator in this order, the second piezoelectric driving part can include the piezoelectric body sandwiched between the lower electrode and the upper electrode in the second actuator, the second piezoelectric driving part can be disposed in a region including a central portion of the oscillation plate in a longitudinal direction of the oscillation plate, and a length of the region in the longitudinal direction of the region can be within 30 to 80% of a length of the oscillation plate.

The aspect 6 can obtain an excellent displacement in the second actuator having a double end beam supporting structure (a both-end supporting structure), which is preferred.

(Aspect 7):

In the piezoelectric actuator according to any one of the aspects 1 to 5, the second actuator can include a lower electrode, a piezoelectric body, and an upper electrode which are stacked on an oscillation plate in the thickness direction of the second actuator in this order, the second piezoelectric driving part can include the piezoelectric body sandwiched between the lower electrode and the upper electrode in the second actuator, the second piezoelectric driving part can be disposed at end portions on both sides of the oscillation plate in the longitudinal direction of the oscillation plate in the second actuator, and is not disposed at a central portion of the oscillation plate in the longitudinal direction thereof, and a length of the second piezoelectric driving part in the longitudinal direction at each of the end portions of the oscillation plate can be within 15 to 45% of the length of a oscillation plate.

The aspect 7 can obtain an excellent displacement in the second actuator having a double end beam supporting structure (a both-end supporting structure), which is preferred.

(Aspect 8):

In the piezoelectric actuator according to any one of the aspects 1 to 7, the first actuator and the second actuator can be simultaneously applied with the first driving voltage and the second driving voltage, respectively, such that the first actuator and the second actuator are bent in directions opposite to each other, and a thickness-direction displacement of the end portions of the first actuator and a thickness-direction displacement of the central portion of the second actuator are accumulated.

The first driving voltage and the second driving voltage may be identical with each other, but are different from each other. A voltage applied to each actuator is designed in response to a polarization direction of the piezoelectric body of each actuator or an arrangement aspect (aspects 6 and 7) of the piezoelectric driving parts.

(Aspect 9):

In the piezoelectric actuator according to any one of the aspects 1 to 8, each of portions at which both end portions of the first actuator and the second actuator can be coupled has a meander structure.

According to the aspect 9, the coupling portion is deformed easily, so that a further large z-direction (thickness-direction) displacement can be obtained.

(Aspect 10):

In the piezoelectric actuator according to any one of the aspects 1 to 9, a piezoelectric body included in each of the first piezoelectric driving part and the second piezoelectric driving part can be a thin film having a thickness within a range from 1 to 10 μm.

It is preferred that the piezoelectric actuator is constituted using a piezoelectric thin film.

(Aspect 11):

In the piezoelectric actuator according to any one of the aspects 1 to 10, a piezoelectric body included in each of the first piezoelectric driving part and the second piezoelectric driving part can be one or more kinds of perovskite oxides represented by the following formula (P):

$$General\ Formula\ ABO_3 \qquad (P),$$

in the formula,

A: at least one element which is contained in A site and contains Pb,

B: at least one element which is contained in B site and is at least one element of Ti, Zr, V, Nb, Ta, Sb, Cr, Mo, W, Mn, Sc, Co, Cu, In, Sn, Ga, Zn, Cd, Fe and Ni, and O: oxygen.

A standard mole ratio of the A site element, the B site element, and the oxygen element is 1:1:3. However, the mole ratio may be deviated from the standard mole ratio within a range where the perovskite structure can be taken.

Such a piezoelectric body has an excellent piezoelectric characteristic and the piezoelectric body is desirable as the piezoelectric actuator of the presently disclosed subject matter.

(Aspect 12):

In the piezoelectric actuator according to any one of the aspects 1 to 11, a piezoelectric body included in each of the first piezoelectric driving part and the second piezoelectric driving part can be one or more kinds of perovskite oxides represented by the following formula (PX):

$$A_a(Zr_x,Ti_y,M_{b-x-y})_bO_c \quad (PX),$$

in formula,

A: at least one element which is contained in A site and contains Pb,

M is at least one element of V, Nb, Ta and Sb, and $0<x<b$, $0<y<b$, and $0 \leq b-x-y$.

a:b:c=1:1:3 is a standard mole ratio. However, the mole ratio may be deviated from the standard mole ratio within a range where the perovskite structure can be taken.

Such a piezoelectric body has an excellent piezoelectric characteristic and the piezoelectric body is desirable as the piezoelectric actuator of the presently disclosed subject matter.

(Aspect 13):

In the piezoelectric actuator according to any one of the aspects 10 to 12, the piezoelectric body can be a thin film which is formed directly formed on a substrate of an oscillation plate.

By using direct film-forming method such as a gas-phase growth method or a sol-gel method, represented by a sputtering method, a piezoelectric body thin film having a desired piezoelectric performance can be obtained.

Further, since an initial warp due to residual stress can occur in the direct film-forming method, application of the presently disclosed subject matter which can avoid influence of the initial warp is useful.

(Aspect 14):

In the piezoelectric actuator according to any one of the aspects 10 to 13, the piezoelectric body can be a thin film formed by a sputtering method.

(Aspect 15):

A variable capacitor of aspect 15 can include: the piezoelectric actuator according to any one of aspects 1-14; a first flat plate electrode attached to a region on the piezoelectric actuator where a maximum displacement in a thickness direction of the piezoelectric actuator can be obtained; and a second flat plate electrode fixed and arranged so as to face the first flat plate electrode, wherein an electrostatic capacitance is changed by displacing the first flat plate electrode in the thickness direction by driving the piezoelectric actuator to change a distance between the first and second flat plates.

According to the aspect 15, by driving the piezoelectric actuator, the first flat plate electrode (movable electrode) is displaced in the thickness direction. Thereby, an inter-electrode distance (gap) between the second flat plate electrode (fixed electrode) and the first flat plate electrode is changed so that a capacitance is changed.

The piezoelectric actuator according to the presently disclosed subject matter does not cause a rotational motion and can translate in the thickness direction, so that a variable capacitor which is controllable excellently can be realized.

(Aspect 16):

An optical deflection device of aspect 16 can include: the piezoelectric actuator according to any one of aspects 1-14; and a mirror member attached to a region on the piezoelectric actuator where a maximum displacement in a thickness direction of the piezoelectric actuator can be obtained, wherein an optical path of light entering the mirror member is changed by displacing the mirror member in the thickness direction by driving the piezoelectric actuator to change a position of a reflecting face of the mirror member in the thickness direction.

According to the aspect 16, by displacing the mirror member in the thickness direction in a translating manner by driving the piezoelectric actuator, the position of the reflecting face of the mirror member is changed. Thereby, a reflecting point, an optical axis of reflecting light, an optical path length or the like can be changed.

The piezoelectric actuator according to the presently disclosed subject matter does not cause rotational motion and can be displaced in the thickness direction in a translating manner, so that a mirror device which is excellent controllable can be realized.

What is claimed is:

1. A piezoelectric actuator comprising:
a first actuator including a first piezoelectric driving part, a central portion of the first actuator in a longitudinal direction of the first actuator being supported, the first actuator configured to be bent and deformed by applying a first driving voltage to the first piezoelectric driving part, so that both end portions of the first actuator in the longitudinal direction are displaced in a thickness direction of the first actuator; and
a second actuator including a second piezoelectric driving part, both end portions of the second actuator in a longitudinal direction of the second actuator being coupled to the both end portions of the first actuator, the second actuator configured to be bent and deformed in an opposite direction to the first actuator by applying a second driving voltage to the second piezoelectric driving part, so that a central portion of the second actuator in the longitudinal direction of the second actuator is displaced in a thickness direction of the second actuator.

2. The piezoelectric actuator according to claim 1, wherein the first actuator and the second actuator are arranged side by side such that the longitudinal direction of the first actuator and the longitudinal direction of the second actuator are parallel to each other.

3. The piezoelectric actuator according to claim 1, wherein one side end face portion of the first actuator in a short side direction at the central portion of the first actuator is supported by a first supporting body, and
the second actuator is coupled, via second supporting bodies, to both end portions of the first actuator positioned on an opposite side to the one side end face portion supported by the first supporting body.

4. The piezoelectric actuator according to claim 1, further comprising
a plurality of actuator groups including the first actuator and the second actuator which are coupled to each other, wherein
the central portion of the second actuator included in one actuator group and a central portion of the first actuator included in the other actuator group arranged adjacent to the one actuator group are coupled to each other.

5. The piezoelectric actuator according to claim 1, wherein each of the first actuator and the second actuator is a unimorph actuator including a lower electrode, a piezoelectric body, and an upper electrode which are stacked on an oscillation plate in a thickness direction of each of the first actuator and the second actuator in this order.

6. The piezoelectric actuator according to claim 1, wherein the second actuator includes a lower electrode, a piezoelectric body, and an upper electrode which are stacked on an oscillation plate in the thickness direction of the second actuator in this order,
the second piezoelectric driving part includes the piezoelectric body sandwiched between the lower electrode and the upper electrode in the second actuator, the second piezoelectric driving part is disposed in a region including a central portion of the oscillation plate in a longitudinal direction of the oscillation plate, and a length of the region in the longitudinal direction of the region is within 30 to 80% of a length of the oscillation plate.

7. The piezoelectric actuator according to claim 1, wherein the second actuator includes a lower electrode, a piezoelectric body, and an upper electrode which are stacked on an oscillation plate in the thickness direction of the second actuator in this order, the second piezoelectric driving part includes the piezoelectric body sandwiched between the lower electrode and the upper electrode in the second actuator, the second piezoelectric driving part is disposed at end portions on both sides of the oscillation plate in the longitudinal direction of the oscillation plate in the second actuator, and is not disposed at a central portion of the oscillation plate in the longitudinal direction thereof, and a length of the second piezoelectric driving part in the longitudinal direction at each of the end portions of the oscillation plate is within 15 to 45% of the length of a oscillation plate.

8. The piezoelectric actuator according to claim 1, wherein the first actuator and the second actuator are simultaneously applied with the first driving voltage and the second driving voltage, respectively, such that the first actuator and the second actuator are bent in directions opposite to each other, and a thickness-direction displacement of the end portions of the first actuator and a thickness-direction displacement of the central portion of the second actuator are accumulated.

9. The piezoelectric actuator according to claim 1, wherein each of portions at which both end portions of the first actuator and the second actuator are coupled has a meander structure.

10. The piezoelectric actuator according to claim 1, wherein
a piezoelectric body included in each of the first piezoelectric driving part and the second piezoelectric driving part is a thin film having a thickness within a range from 1 to 10 μm.

11. The piezoelectric actuator according to claim 10, wherein
the piezoelectric body is a thin film which is formed directly formed on a substrate of an oscillation plate.

12. The piezoelectric actuator according to claim 10, wherein
the piezoelectric body is a thin film formed by a sputtering method.

13. The piezoelectric actuator according to claim 1, wherein
a piezoelectric body included in each of the first piezoelectric driving part and the second piezoelectric driving part is one or more kinds of perovskite oxides represented by the following formula (P):

$$A_a B_b O_3 \quad \text{General Formula } ABO_3 \tag{P}$$

in the formula,
A: at least one element which is contained in A site and contains Pb,
B: at least one element which is contained in B site and is at least one element of Ti, Zr, V, Nb, Ta, Sb, Cr, Mo, W, Mn, Sc, Co, Cu, In, Sn, Ga, Zn, Cd, Fe and Ni, and
O: oxygen.

14. The piezoelectric actuator according to claim 1, wherein
a piezoelectric body included in each of the first piezoelectric driving part and the second piezoelectric driving part is one or more kinds of perovskite oxides represented by the following formula (PX):

$$A_a(Zr_x, Ti_y, M_{b-x-y})_b O_c \tag{PX}$$

in formula,
A: at least one element which is contained in A site and contains Pb,
M is at least one element of V, Nb, Ta and Sb, and
$0<x<b$, $0<y<b$, and $0 \le b-x-y$.

15. A variable capacitor comprising:
the piezoelectric actuator according to claim 1;
a first flat plate electrode attached to a region on the piezoelectric actuator where a maximum displacement in a thickness direction of the piezoelectric actuator can be obtained; and
a second flat plate electrode fixed and arranged so as to face the first flat plate electrode, wherein
an electrostatic capacitance is changed by displacing the first flat plate electrode in the thickness direction by driving the piezoelectric actuator to change a distance between the first and second flat plates.

16. An optical deflection device comprising:
the piezoelectric actuator according to claim 1; and
a mirror member attached to a region on the piezoelectric actuator where a maximum displacement in a thickness direction of the piezoelectric actuator can be obtained, wherein
an optical path of light entering the mirror member is changed by displacing the mirror member in the thickness direction by driving the piezoelectric actuator to change a position of a reflecting face of the mirror member in the thickness direction.

17. The piezoelectric actuator according to claim 1, wherein
a first supporting body is provided at the central portion of the first actuator in the longitudinal direction of the first actuator, and the central portion of the first actuator is supported via the first supporting body, and
a second supporting body is provided at said both end portions of the second actuator in the longitudinal direction of the second actuator, and said both end portions of the second actuator are respectively coupled to said both end portions of the first actuator in the longitudinal direction via the second supporting body.

18. The piezoelectric actuator according to claim 17, wherein
said both end portions of the first actuator in the longitudinal direction of the first actuator are displaced, by applying the first driving voltage to the first piezoelectric driving part, in the same direction along the thickness direction with the first supporting body as a reference, and
the central portion of the second actuator is displaced, by applying the second driving voltage to the second piezoelectric driving part, in the same direction along the thickness direction with the second supporting body as a reference.

* * * * *